US012764920B2

(12) United States Patent
Kao et al.

(10) Patent No.: US 12,764,920 B2
(45) Date of Patent: Oct. 13, 2026

(54) CAPACITORLESS DYNAMIC RANDOM ACCESS MEMORY AND METHODS OF FORMATION

(71) Applicant: Taiwan Semiconductor Manufacturing Company, Ltd., Hsinchu (TW)

(72) Inventors: Yun-Feng Kao, New Taipei City (TW); Chia Yu Ling, Hsinchu City (TW); Katherine H. Chiang, New Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1078 days.

(21) Appl. No.: 17/822,390

(22) Filed: Aug. 25, 2022

(65) Prior Publication Data

US 2024/0074137 A1 Feb. 29, 2024

(51) Int. Cl.
*H10B 12/00* (2023.01)

(52) U.S. Cl.
CPC ............. *H10B 12/00* (2023.02); *H10B 12/20* (2023.02)

(58) Field of Classification Search
None
See application file for complete search history.

(56) References Cited

U.S. PATENT DOCUMENTS 7,764,540 B2 7/2010 Morishita et al.
2005/0128787 A1 6/2005 Mouli
2020/0066326 A1* 2/2020 Rios ...................... G11C 11/409
2024/0049457 A1* 2/2024 Xiao ...................... H10B 12/02
2025/0192113 A1* 6/2025 Kurokawa ............. H10B 10/12
2025/0246226 A1* 7/2025 Furutani ............. G11C 11/4076
2025/0287612 A1* 9/2025 Yakubo ................. G11C 11/405

FOREIGN PATENT DOCUMENTS

CN 114334980 A * 4/2022
CN 115274669 A * 11/2022 ............ H01L 21/71
TW 200739584 A 10/2007

OTHER PUBLICATIONS

Translation of CN-114334980-A (Year: 2022).*
Translation of CN-115274669-A (Year: 2022).*

* cited by examiner

*Primary Examiner* — William Henry Anderson
(74) *Attorney, Agent, or Firm* — Harrity & Harrity, LLP

(57) ABSTRACT

A capacitorless dynamic random access memory (DRAM) cell may include a plurality of transistors. At least a subset of the transistors may include a channel layer that approximately resembles an inverted U shape, an ohm symbol (Ω) shape, or an uppercase/capital omega (Ω) shape. The particular shape of the channel layer provides an increased channel length for the subset of the transistors, which may reduce the off current and may reduce current leakage in the subset of the transistors. The reduced off current and reduced current leakage may increase data retention in the subset of the transistors and/or may increase the reliability of the subset of the transistors without increasing the footprint of the subset of the transistors. Moreover, the particular shape of the channel layer enables the subset of the transistors to be formed with a top-gate structure, which provides low integration complexity with other transistors in the capacitorless DRAM cell.

20 Claims, 23 Drawing Sheets

CAPACITORLESS DYNAMIC RANDOM ACCESS MEMORY AND METHODS OF FORMATION

BACKGROUND

Memory devices are used in a wide variety of applications. Memory devices are made up of a plurality of memory cells that are typically arranged in an array of a plurality of rows and a plurality of columns. One type of memory cell includes a dynamic random access memory (DRAM) cell. In some applications, a DRAM cell-based memory device may be selected as opposed to other types of memory cell-based memory devices due to DRAM cell's lower cost, smaller area, and ability to hold a greater amount of data relative to, for example, a static random access memory (SRAM) cell or another type of memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
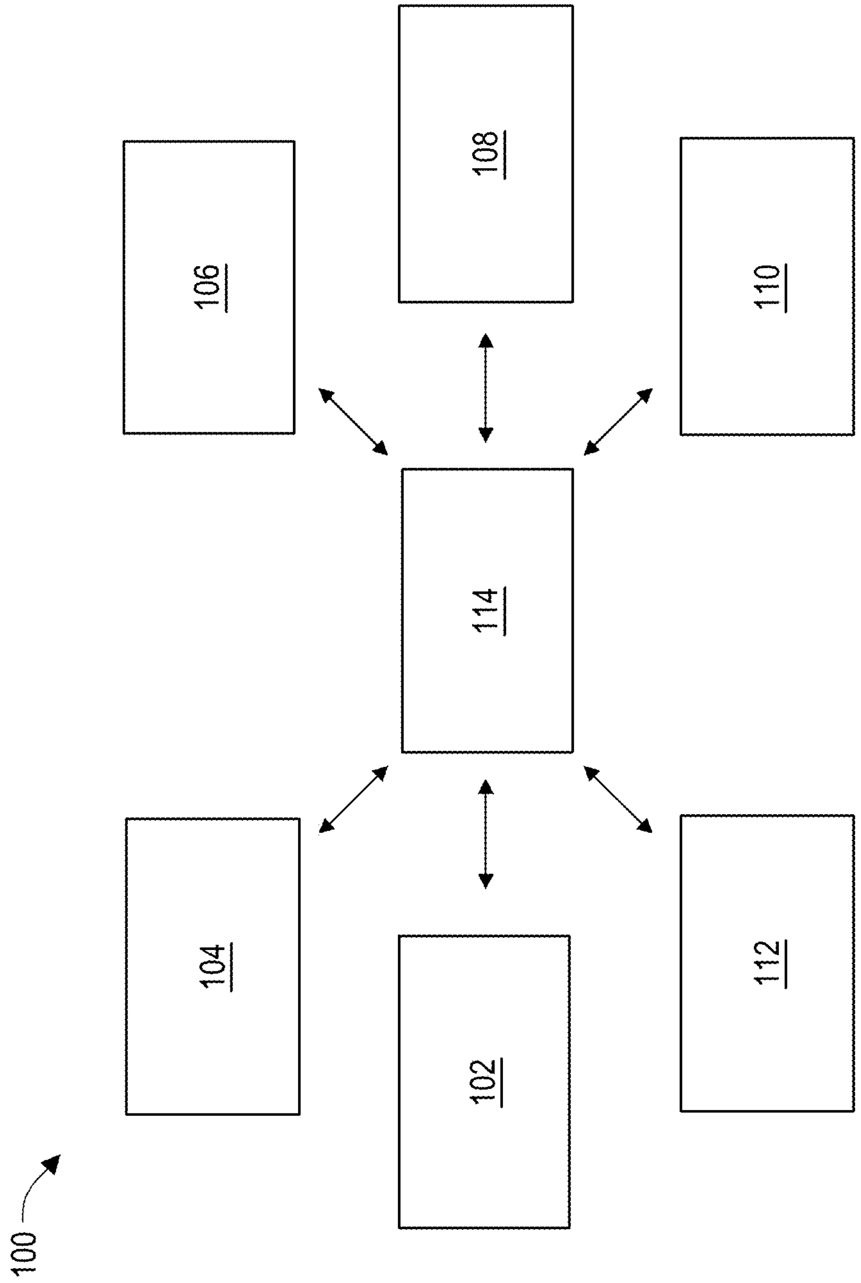
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A dynamic random access memory (DRAM) memory cell is a type of volatile memory cell that typically includes a transistor connected in series with a capacitor. This may be referred to as a one transistor—one capacitor (1T-1C) DRAM cell. The capacitor in a 1T-1C DRAM cell functions as a storage device by selectively storing electric charge. The capacitor may be charged through the transistor, and the amount of charge that is stored in the capacitor may be sensed by discharging the charge that is stored by the capacitor. The logical value (e.g., a 1-value or a 0-value) stored by the 1T-1C DRAM cell may correspond to the amount of charge that is stored by the capacitor.

A capacitor of a DRAM cell (e.g., a 1T-1C DRAM cell or another type of DRAM cell that includes at least one capacitor) may be physically implemented as a deep-trench capacitor. A deep-trench capacitor may provide sufficient sensing margin for the DRAM cell to operate. However, a deep-trench capacitor may be complex to manufacture. Moreover, the manufacturing complexity may increase as the aspect ratio (e.g., the ratio of the height to the width of the deep-trench capacitor) increases. The increased manufacturing complexity may result in greater manufacturing cost of forming DRAM cells, longer manufacturing times for forming DRAM cells, an increased quantity of semiconductor processing operations for forming DRAM cells, and/or decreased DRAM cell yield, among other examples.

Some implementations described herein provide a capacitorless DRAM cell and methods of formation. As described herein, a capacitorless DRAM cell may include a plurality of thin-film transistors (TFTs) that are arranged to selectively store one or more logical values for the capacitorless DRAM cell. The capacitorless configuration of the capacitorless DRAM cell may be formed using transistor-based semiconductor manufacturing techniques as opposed to capacitor-based manufacturing techniques, which may reduce the manufacturing complexity of the capacitorless DRAM cell. This may reduce manufacturing costs of forming DRAM cells in a memory device, may reduce manufacturing times for forming DRAM cells in a memory device, may reduce the quantity of semiconductor processing operations for forming DRAM cells in a memory device, and/or may increase DRAM cell yield in a memory device, among other examples.

At least a subset of the thin-film transistors may include a channel layer that approximately resembles an inverted U shape, an ohm symbol (Ω) shape, or an uppercase/capital omega (Ω) shape. This particular shape of the channel layer provides an increased channel length for the subset of the transistors, which may reduce the off current and may reduce current leakage in the subset of the transistors. The reduced off current and reduced current leakage may increase data retention in the subset of the transistors and/or may increase the reliability of the subset of the transistors without increasing the footprint of the subset of the transistors. Moreover, the particular shape of the channel layer enables the subset of the transistors to be formed with a top-gate structure (e.g., where the gate electrode is located over the channel layer), which provides low integration complexity and with transistors in the capacitorless DRAM cell having a bottom-gate structure (e.g., where the gate electrode is located under the channel layer).

FIG. 1 is a diagram of an example environment 100 in which systems and/or methods described herein may be implemented. As shown in FIG. 1, the example environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMES), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the example environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

In some implementations, one or more of the semiconductor processing tools 102-112 and/or the wafer/die transport tool 114 may perform one or more semiconductor processing operations described herein. For example, one or more of the semiconductor processing tools 102-112 and/or the wafer/die transport tool 114 may form a first transistor coupled with a read word line conductive structure and a read bit line conductive structure; may form a second transistor above the first transistor and coupled with the first transistor and to a ground conductive structure; and/or may form a third transistor above the second transistor and coupled with the second transistor, a write word line conductive structure, and a write bit line conductive structure, where at least one of the second transistor or the third transistor comprises a channel layer that includes an inverted approximately U-shaped portion and a plurality of extension portions, each coupled with a respective end of the inverted approximately U-shaped portion.

As another example, one or more of the semiconductor processing tools 102-112 and/or the wafer/die transport tool 114 may form a first transistor coupled with a read word line conductive structure and a read bit line conductive structure; may form a second transistor above the first transistor and coupled with the first transistor and to a ground conductive structure, where the second transistor includes a first plurality of source/drain regions, a first channel layer above the first plurality of source/drain regions, and a first gate structure above the first plurality of source/drain regions and at least partially wrapping around the first channel layer; and/or may form a third transistor above the second transistor and coupled with the second transistor, a write word line conductive structure, and a write bit line conductive structure, where the third transistor includes a second plurality of source/drain regions, a second channel layer above the second plurality of source/drain regions, and a second gate structure above the second plurality of source/drain regions and at least partially wrapping around the second channel layer.

As another example, one or more of the semiconductor processing tools 102-112 and/or the wafer/die transport tool 114 may form, in a dielectric layer, a first source/drain region and a second source/drain region of a transistor of a memory cell; may form a dielectric support structure above the first source/drain region and above the second source/drain region; may form a channel layer of the transistor such that the channel layer is on the dielectric support structure and above the first source/drain region and the second source/drain region, where the channel layer wraps around three sides of the dielectric support structure and extends over top surfaces of the first source/drain region and the second source/drain region; may form a gate dielectric layer of the transistor over the channel layer; and/or may form a gate structure of the transistor over the gate dielectric layer.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
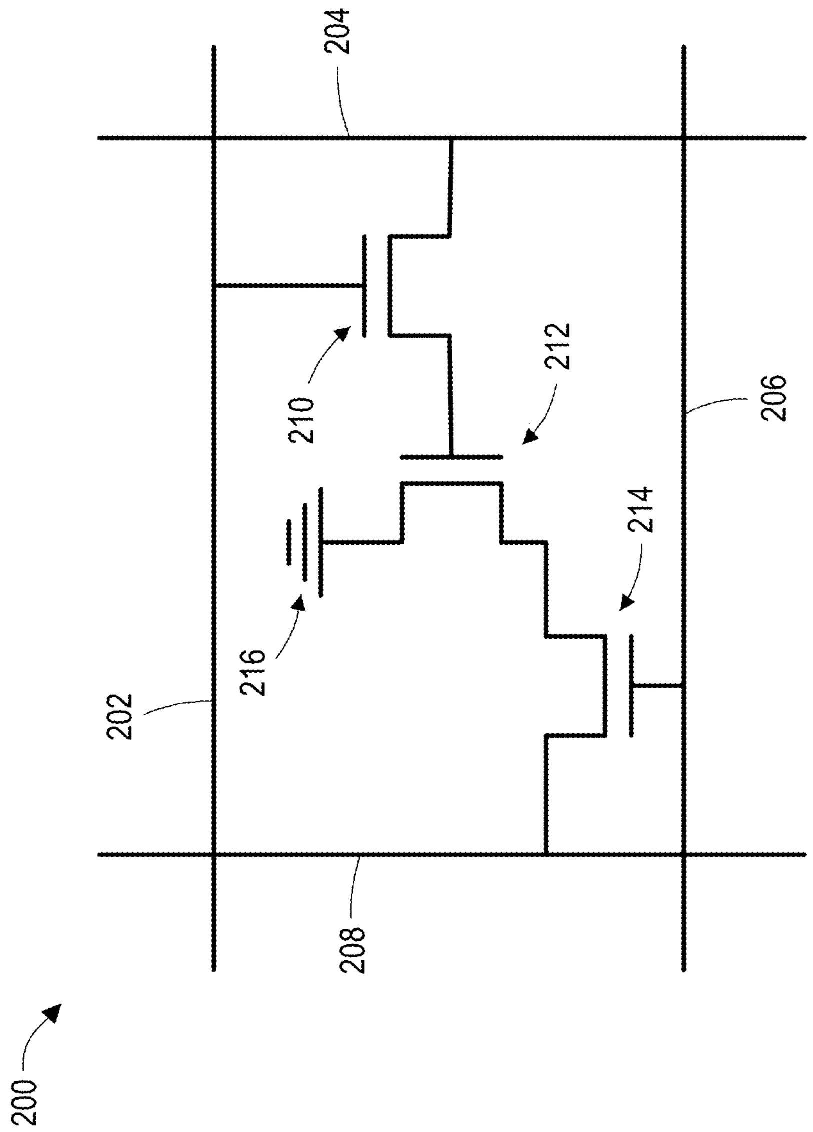
FIG. 2 is a circuit diagram of an example memory cell described herein.

FIG. 2 is a circuit diagram of a memory cell 200 described herein. The memory cell 200 may include a DRAM cell or another type of memory cell. The memory cell 200 may be referred to as a capacitorless memory cell or a capacitorless DRAM cell in that the memory cell 200 is composed entirely of transistors without a dedicated storage capacitor for selectively storing a memory cell value (e.g., a 1-value or a 0-value). The memory cell 200 may be included in a memory device (e.g., a DRAM device or DRAM chip) and/or in another type of device such as a logic device (e.g., a central processing unit (CPU), a graphics processing unit (GPU), a field programmable gate array (FPGA), an application specific integrated circuit (ASIC)), among other examples.

As shown in FIG. 2, the memory cell 200 may include a write word line 202, a write bit line 204, a read word line 206, and a read bit line 208. As further shown in FIG. 2, the memory cell 200 may include a write transistor 210, a storage transistor 212, and a read transistor 214. Each of the write transistor 210, the storage transistor 212, and the read transistor 214 may include an n-type transistor. Alternatively, each of the write transistor 210, the storage transistor 212, and the read transistor 214 may include a p-type transistor or a combination of n-type transistors and p-type transistors.

The gate terminal of the write transistor 210 may be coupled with the write word line 202. The source terminal of the write transistor 210 may be coupled with the write bit line 204. The gate terminal of the storage transistor 212 may be coupled with the train terminal of the write transistor 210. The source terminal of the write transistor 210 may be coupled with an electrical ground 216. The drain terminal of the storage transistor 212 may be coupled with a source terminal of the read transistor 214. The gate terminal of the read transistor 214 may be coupled with the read word line 206. The drain terminal of the read transistor 214 may be coupled with the read bit line 208. The write word line 202, the write bit line 204, the read word line 206, and the read bit line 208 may be coupled with circuitry, including control circuitry, a read buffer, a write buffer, and/or another type of circuitry.

The memory cell 200 may be referred to as a three-transistor (3T) memory cell because of the three transistor configuration of the memory cell 200. More particularly, the memory cell 200 may be referred to as a capacitorless 3T memory cell (e.g., a capacitorless 3T DRAM cell) in that the memory cell 200 does not include a dedicated storage capacitor for selectively storing a charge (and an associated logical value). Instead, the memory cell 200 may be configured to store a charge (and an associated logical value) based on the gate capacitance of the gate terminal of the storage transistor 212. The gate capacitance of the storage transistor 212 results from an electrical field being formed between the gate terminal of the storage transistor 212 and a conductive channel of the storage transistor 212 when the gate terminal is energized with a gate voltage. When the gate voltage is removed from the gate terminal, the gate capacitance provided by the electric field causes an electrical charge to be retained. The electrical charge may be used to read a current from the storage transistor 212.

In an example write operation of the memory cell 200, the write word line 202 may be activated (e.g., a voltage or a current may be applied to the write word line 202) to select the memory cell 200. The activation of the write word line 202 causes a voltage to be applied to the gate terminal of the write transistor 210, which enables a high voltage potential on the write bit line 204 to flow from the source terminal of the write transistor 210 to the drain terminal of the write transistor 210, and from the drain terminal of the write transistor 210 to the gate terminal of the storage transistor 212. This activates the gate terminal of the storage transistor 212 and causes a conductive channel to form between the source terminal and the drain terminal of the storage transistor 212, thereby "storing" a logical 1-value (or 0-value) in the storage transistor 212. In some implementations, the memory cell 200 may be subsequently refreshed to maintain the charge stored by the storage transistor 212 based on the gate capacitance of the storage transistor 212. The memory cell 200 may therefore be referred to as a dynamic memory cell or DRAM cell.

In an example read operation of the memory cell 200, the read word line 206 may be activated (e.g., a voltage or a current may be applied to the read word line 206) to select the memory cell 200. The activation of the read word line 206 causes a voltage to be applied to the gate terminal of the read transistor 214. The activation of the read word line 206, and the charge stored by the storage transistor 212 based on the gate capacitance of the storage transistor 212, enables a current to flow from the drain terminal of the storage transistor 212 to the source terminal of the read transistor 214, from the source terminal of the read transistor 214 to the drain terminal of the read transistor 214, and from the drain terminal of the read transistor 214 to the read bit line 208. Alternatively, if the storage transistor 212 is deactivated, no current flows to the read bit line 208 when the read word line 206 is activated.

As indicated above, FIG. 2 is provided as an example. Other examples may differ from what is described with regard to FIG. 2.

Figure 3:
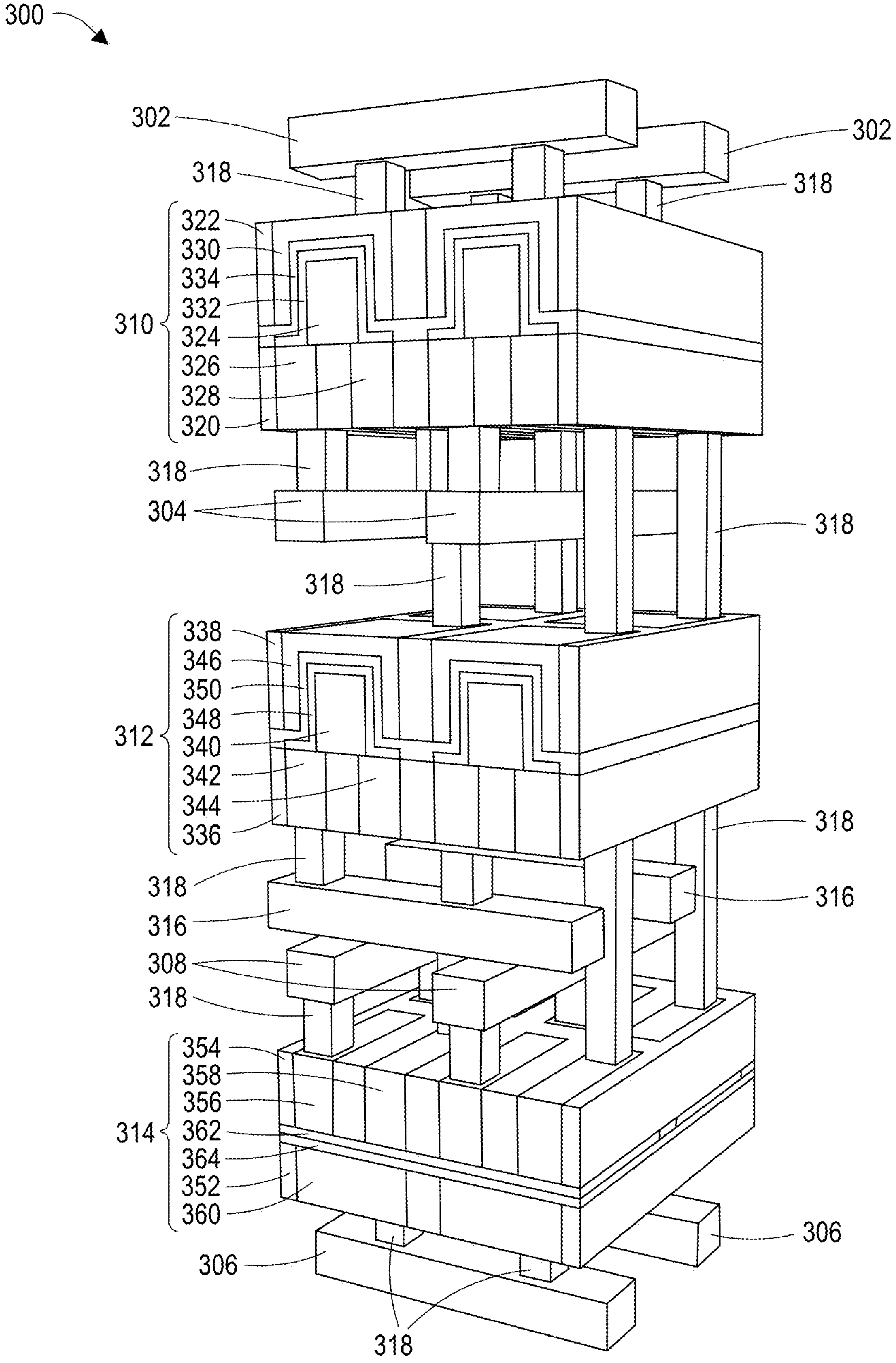
FIG. 3 is a diagram of an example memory cell structure described herein.

FIG. 3 is a diagram of an example memory cell structure 300 described herein. The circuit diagram of a memory cell 200 may be physically implemented as the memory cell structure 300. Accordingly, the memory cell structure 300 may include a capacitorless memory cell structure (e.g., a capacitorless 3T DRAM cell structure and/or another type of capacitorless memory cell structure) that includes a plurality of transistors. The example illustrated in FIG. 3 may illustrate a plurality of memory cell structures (e.g., of a memory device or another type of semiconductor device). However, only one instance of each component of a memory cell structure 300 is described in connection with FIG. 3 for clarity and simplicity. It is noted that one or more other memory cell structures illustrated in FIG. 3 may conform to the configuration described in connection with FIG. 3.

As shown in FIG. 3, the memory cell structure 300 may include a write word line conductive structure 302 corresponding to the write word line 202, a write bit line conductive structure 304 corresponding to the write bit line 204, a read word line conductive structure 306 corresponding to the read word line 206, and a read bit line conductive structure 308 corresponding to the read bit line 208. As further shown in FIG. 3, the memory cell structure 300 may include a write transistor 310 corresponding to the write transistor 210, a storage transistor 312 corresponding to the storage transistor 212, and a read transistor 314 corresponding to the read transistor 214.

The write transistor 310, the storage transistor 312, and the read transistor 314 may be vertically arranged, as shown in the example in FIG. 3. The write transistor 310 may be located above and/or over the storage transistor 312, and the storage transistor 312 may be located below and/or under the write transistor 310. The storage transistor 312 may be located above and/or over the read transistor 314, and the read transistor 314 may be located below and/or under the storage transistor 312. The storage transistor 312 may be located between the read transistor 314 and the write transistor 310.

The read word line conductive structure 306 may be located below and/or under the read transistor 314, and the read transistor 314 may be located above and/or over the read word line conductive structure 306. The read bit line conductive structure 308 may be located between the storage transistor 312 and the read transistor 314. The read bit line conductive structure 308 may be located above and/or over the read transistor 314, and the read transistor 314 may be located below and/or under the read bit line conductive structure 308.

A ground conductive structure 316 may also be located between the storage transistor 312 and the read transistor 314. The ground conductive structure 316 may be located above and/or over the read transistor 314, and the read transistor 314 may be located below and/or under the ground conductive structure 316. The ground conductive structure 316 may be located above and/or over the read bit line conductive structure 308, and the ground conductive structure 316 may be located above and/or over the read bit line conductive structure 308.

The read bit line conductive structure 308 may be located below and/or under the storage transistor 312, and the storage transistor 312 may be located above and/or over the read bit line conductive structure 308. The ground conductive structure 316 may be located below and/or under the storage transistor 312, and the storage transistor 312 may be located above and/or over the ground conductive structure 316.

The write bit line conductive structure 304 may be located above and/or over the storage transistor 312, and the storage transistor 312 may be located below and/or under the write bit line conductive structure 304. The write bit line conductive structure 304 may be located between the storage transistor 312 and the write transistor 310. The write transistor 310 may be located above and/or over the write bit line conductive structure 304, and the write bit line conductive structure 304 maybe located below and/or under the write transistor 310. The write word line conductive structure 302 may be located above and/or over the write transistor 310, and the write transistor 310 may be located below and/or under the write word line conductive structure 302.

The write word line conductive structure 302 may be coupled with (or electrically and/or physically connected with) the write transistor 310 by one or more interconnect structures 318. The write bit line conductive structure 304 may be coupled with (or electrically and/or physically connected with) the write transistor 310 by one or more interconnect structures 318. The write transistor 310 and the storage transistor 312 may be coupled (or electrically and/or physically connected) by one or more interconnect structures 318.

The ground conductive structure 316 may be coupled with (or electrically and/or physically connected with) the storage transistor 312 by one or more interconnect structures 318. The storage transistor 312 and the read transistor 314 may be coupled (or electrically and/or physically connected) by one or more interconnect structures 318.

The read bit line conductive structure 308 may be coupled with (or electrically and/or physically connected with) the read transistor 314 by one or more interconnect structures 318. The read word line conductive structure 306 may be coupled with (or electrically and/or physically connected with) the read transistor 314 by one or more interconnect structures 318.

The write word line conductive structure 302, the write bit line conductive structure 304, the read word line conductive structure 306, the read bit line conductive structure 308, and the ground conductive structure 316 may each include one or more types of conductive structures, such as conductive trenches, conductive vias, conductive pads, and/or conductive metallization layers, among other examples. The interconnect structures 318 may include one or more types of conductive structures, such as conductive trenches, conductive vias, conductive pads, and/or conductive metallization layers, among other examples. The write word line conductive structure 302, the write bit line conductive structure 304, the read word line conductive structure 306, the read bit line conductive structure 308, the ground conductive structure 316, and the interconnect structures 318 may each include one or more conductive materials, such as one or more metals, one or more metal alloys, and/or one or more other types of conductive materials. Examples include copper (Cu), cobalt (Co), ruthenium (Ru), titanium (Ti), tungsten (W), gold (Au), and/or silver (Ag), among other examples.

In some implementations, one or more of the write word line conductive structure 302, the write bit line conductive structure 304, the read word line conductive structure 306, the read bit line conductive structure 308, the ground conductive structure 316, and/or the interconnect structures 318 may be included in one or more dielectric layers that provide electrical isolation between these structures and/or adjacent structures. In these implementations, one or more liners and/or adhesion layers may be included around the write word line conductive structure 302, the write bit line conductive structure 304, the read word line conductive structure 306, the read bit line conductive structure 308, the ground conductive structure 316, and/or the interconnect structures 318 to promote adhesion with the one or more dielectric layers and/or to resist electron migration into the one or more dielectric layers.

As further shown in FIG. 3, the read transistor 310 may include a dielectric layer 320, a dielectric layer 322 above and/or over the dielectric layer 320, a dielectric support structure 324 above and/or over the dielectric layer 320, a source/drain region in the dielectric layer 320, a source/drain region 328 in the dielectric layer 320 and adjacent to (and/or side-by-side with) the source/drain region 326, a gate structure 330, a channel layer 332, and a gate dielectric layer 334 between the gate structure 330 and the channel layer 332. A source/drain region, as used herein, may refer to a source region, a drain region, or both a source region and a drain region, depending on the context. The source/drain region 326 may correspond to the source terminal of the write transistor 210, and may be coupled with (or electrically and/or physically connected with) the write bit line conductive structure 304. The source/drain region 328 may correspond to the drain terminal of the write transistor 210, and may be coupled with (or electrically and/or physically connected with) the storage transistor 312. The gate structure 330 may correspond to the gate terminal of the write transistor 210, and may be coupled with (or electrically and/or physically connected with) the write word line conductive structure 302.

The storage transistor 312 may include a dielectric layer 336, a dielectric layer 338 above and/or over the dielectric layer 336, a dielectric support structure 340 above and/or over the dielectric layer 336, a source/drain region 342 in the dielectric layer 336, a source/drain region 344 in the dielectric layer 336 and adjacent to (and/or side-by-side with) the source/drain region 342, a gate structure 346, a channel layer 348, and a gate dielectric layer 350 between the gate structure 346 and the channel layer 348. The source/drain region 342 may correspond to the source terminal of the storage transistor 212, and may be coupled with (or electrically and/or physically connected with) the ground conductive structure 316. The source/drain region 344 may correspond to the drain terminal of the storage transistor 212, and may be coupled with (or electrically and/or physically connected with) the read transistor 314. The gate structure 346 may correspond to the gate terminal of the storage transistor 312, and may be coupled with (or electrically and/or physically connected with) the source/drain region 328 of the write transistor 310.

The read transistor 314 may include a dielectric layer 352, a dielectric layer 354 above and/or over the dielectric layer 352, a source/drain region 356 in the dielectric layer 354, a source/drain region 358 in the dielectric layer 354 and adjacent to (and/or side-by-side with) the source/drain region 356, a gate structure 360 in the dielectric layer 352 and below and/or under the source/drain region 356 and the source/drain region 358, a channel layer 362 between the gate structure 360 and the source/drain region 356 and the source/drain region 358, and a gate dielectric layer 364 between the gate structure 360 and the channel layer 362. The source/drain region 356 may correspond to the drain terminal of the read transistor 214, and may be coupled with (or electrically and/or physically connected with) the read bit line conductive structure 308. The source/drain region 358 may correspond to the source terminal of the read transistor 214, and may be coupled with (or electrically and/or physically connected with) the source/drain region 344 of the storage transistor 312. The gate structure 360 may correspond to the gate terminal of the read transistor 314, and may be coupled with (or electrically and/or physically connected with) the read word line conductive structure 306.

The dielectric layers 320, 322, 336, 338, 352, and 354 may each include one or more dielectric materials, such as an oxide, a nitride, a silicon oxide ($SiO_x$), a silicon nitride ($Si_xN_y$), a silicon oxynitride (SiON), fluoride-doped silicate glass (FSG), a low-k dielectric material, and/or another suitable electrically insulating material. The dielectric support structures 324 and 340 may each include one or more dielectric materials, such as an oxide, a nitride, a silicon oxide ($SiO_x$), a silicon nitride ($Si_xN_y$), a silicon oxynitride (SiON), fluoride-doped silicate glass (FSG), a low dielectric constant (low-k) material, and/or another suitable electrically insulating material.

The source/drain regions 326, 328, 342, 344, 356, and 358 may each include one or more semiconductor materials, such as silicon (Si), germanium (Ge), doped silicon, and/or doped germanium, among other examples. The gate structures 330, 346, and 360 may each include polysilicon (e.g., polycrystalline silicon), one or more conductive materials, one or more high-k materials, and/or a combination thereof.

The channel layers 332, 348, and 362 may each include one or more semiconductor materials, such as silicon (Si), germanium (Ge), doped silicon, and/or doped germanium, among other examples. The gate dielectric layers 334, 350, and 364 may each include one or more dielectric materials, including high dielectric constant (high-k) materials such as hafnium silicate ($HfO_xSi$), zirconium silicate ($ZrSiO_x$), hafnium oxide ($HfO_x$), and/or zirconium oxide ($ZrO_x$), among other examples.

As further shown in FIG. 3, the transistors of the memory cell structure 300 may configured and/or arranged in a particular configuration to reduce and/or minimize the cell size of the memory cell structure 300, to reduce and/or minimize the manufacturing cost and complexity of the memory cell structure 300, and/or to reduce and/or minimize current leakage in the memory cell structure 300, among other examples.

For example, the read transistor 314 may be configured and/or arranged as a "bottom gate" thin-film transistor, in which the gate structure 360 of the read transistor 314 is located below and/or under the source/drain regions 356 and 358 of the read transistor 314, and the source/drain regions 356 and 358 are located above and/or over the gate structure 360. This enables the gate structure 360 to be coupled with the read word line conductive structure 306, the source/drain region 356 to be coupled with the read bit line conductive structure 308, and the source/drain region 358 to be coupled with the source/drain region 344 of the storage transistor 312 in a stacked or vertically arranged manner.

Additionally and/or alternatively, the storage transistor 312 may be configured and/or arranged as a "top gate" thin-film transistor, in which the gate structure 346 of the storage transistor 312 is located above and/or over the source/drain regions 342 and 344 of the storage transistor 312, and the source/drain regions 342 and 344 are located below and/or under the gate structure 346. This enables the gate structure 346 to be coupled with the source/drain region 328 of the write transistor 310, the source/drain region 342 to be coupled with the ground conductive structure 316, and the source/drain region 344 to be coupled with the source/drain region 358 of the read transistor 314 in a stacked or vertically arranged manner.

Additionally and/or alternatively, the write transistor 310 may be configured and/or arranged as a "top gate" thin-film transistor, in which the gate structure 330 of the write transistor 310 is located above and/or over the source/drain regions 326 and 326 of the write transistor 310, and the source/drain regions 326 and 326 are located below and/or under the gate structure 330. This enables the gate structure 330 to be coupled with the write word line conductive structure 302, the source/drain region 326 to be coupled with the write bit line conductive structure 304, and the source/drain region 328 to be coupled with the gate structure 346 of the storage transistor 312 in a stacked or vertically arranged manner.

Additionally and/or alternatively, the channel layer 332 of the write transistor 310 may be configured and/or arranged as a shape that approximately resembles an inverted U shape, an ohm symbol (Ω) shape, or an uppercase/capital omega (Ω) shape. The channel layer 332 may accordingly be referred to as an "omega channel," and the write transistor 310 may accordingly be referred to as an "omega channel transistor." This particular shape of the channel layer 332 may provide an increased channel length for the write transistor 310, which may reduce the off current and may reduce current leakage in the write transistor 310. The reduced off current and reduced current leakage may increase data retention in the memory cell structure 300 and/or may increase the reliability of the write transistor 310 without increasing the footprint of the write transistor 310.

The channel layer 348 of the storage transistor 312 may be configured and/or arranged as a shape that approximately resembles an inverted U shape, an ohm symbol (Ω) shape, or an uppercase/capital omega (Ω) shape in addition to (or instead of) the channel layer 332 of the write transistor 310. In these implementations, the channel layer 348 may accordingly be referred to as an "omega channel," and the storage transistor 312 may accordingly be referred to as an "omega channel transistor." This particular shape of the channel layer 348 may provide an increased channel length for the storage transistor 312, which may reduce the off current and may reduce current leakage in the storage transistor 312. The reduced off current and reduced current leakage may increase data retention in the memory cell structure 300 and/or may increase the reliability of the storage transistor 312 without increasing the footprint of the storage transistor 312.

As indicated above, FIG. 3 is provided as an example. Other examples may differ from what is described with regard to FIG. 3.

Figure 4A:
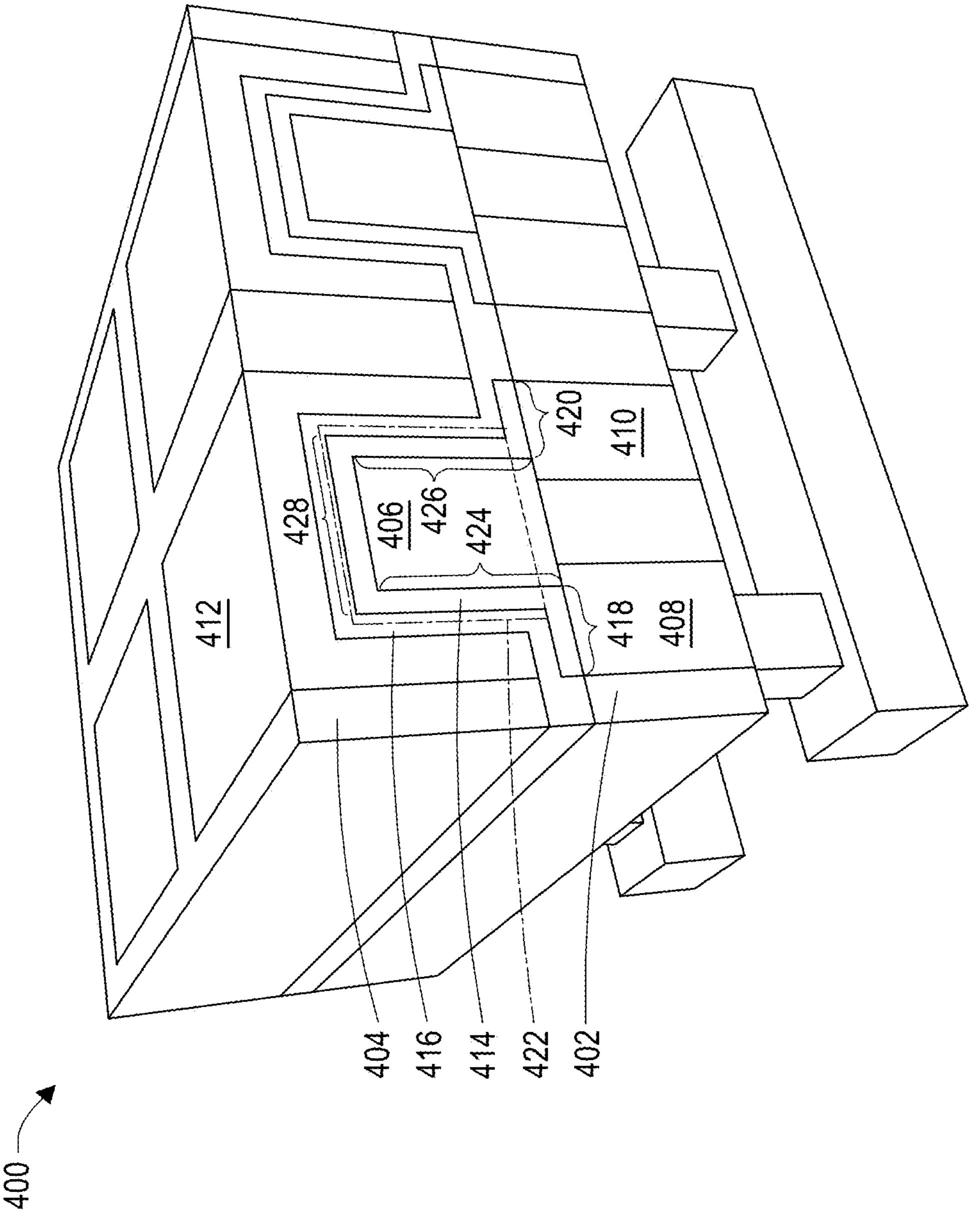
FIGS. 4A, 4B, and 5 are example implementations of a transistor of a memory cell structure described herein.
Figure 4B:
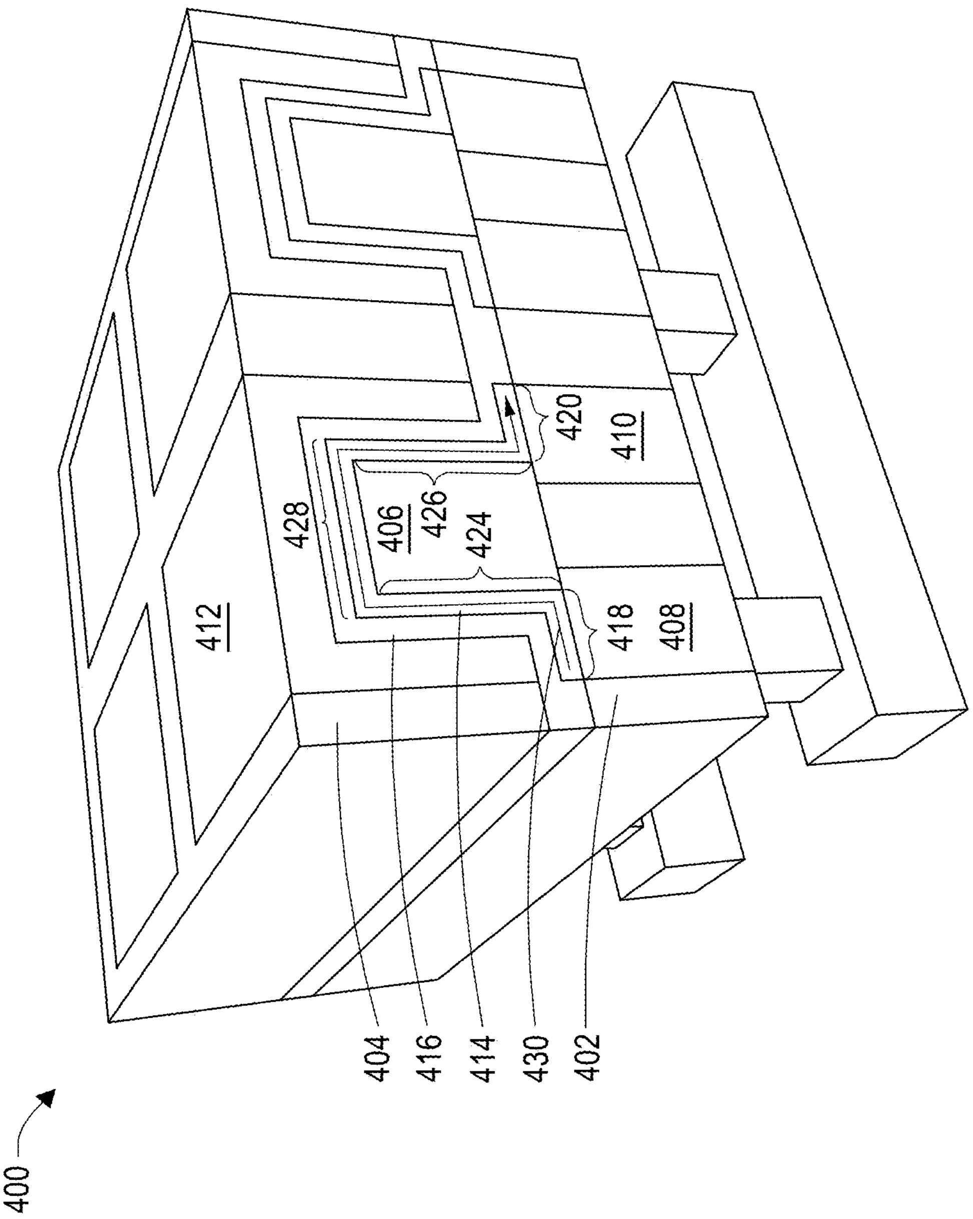

FIGS. 4A and 4B are diagrams of an example transistor 400 of a memory cell structure described herein. The transistor 400 may include an example of an omega-channel transistor (or a transistor that includes a channel layer having an approximately inverted U or ohm symbol shape). In some implementations, one or more transistors in the memory cell structure 300 may be implemented as the transistor 400, such as the write transistor 310 and/or the storage transistor 312. In some implementations, the transistor configuration illustrated in FIGS. 4A and 4B may be included in one or more of the transistors included in another memory cell structure, such as memory cell structure 700 illustrated in connection with FIG. 7, among other examples.

As shown in FIG. 4A, the transistor 400 may include a dielectric layer 402 and a dielectric layer 404 above and/or over the dielectric layer 404. In some implementations, the dielectric layer 402 and the dielectric layer 404 respectively correspond to the dielectric layer 320 and the dielectric layer 322 of the write transistor 310. In some implementations, the dielectric layer 402 and the dielectric layer 404 respectively correspond to the dielectric layer 336 and the dielectric layer 338 of the storage transistor 312. A dielectric support structure 406 may be located above and/or over the dielectric layer 402. In some implementations, the dielectric support structure 406 corresponds to the dielectric support structure 324 of the write transistor 310. In some implementations, dielectric support structure 406 corresponds to the dielectric support structure 340 of the storage transistor 312.

A source/drain region 408 may be located in the dielectric layer 402 and below the dielectric layer 404 and the dielectric support structure 406. Another source/drain region 410 may be located in the dielectric layer 402 and below the dielectric layer 404 and the dielectric support structure 406. The source/drain region 408 and the source/drain region 410 may be adjacent and/or side-by-side in the dielectric layer 402, and may be physically and electrically isolated by a portion of the dielectric layer 402. In some implementations, the source/drain region 408 and the source/drain region 410 respectively correspond to the source/drain region 326 and the source/drain region 328 of the write transistor 310. In some implementations, the source/drain region 408 and the source/drain region 410 respectively correspond to the source/drain region 342 and the source/drain region 344 of the storage transistor 312.

A gate structure 412 may be included in the dielectric layer 404. The gate structure 412 may be located above and/or over the dielectric support structure 406, the source/drain region 408, and/or the source/drain region 410. As shown in FIG. 4A, the shape of the gate structure 412 may at least partially conform to the shape of the dielectric support structure 406 due to the gate structure 412 being formed after the dielectric support structure 406, as described in connection with FIGS. 6A-6F. In some implementations, the gate structure 412 corresponds to the gate structure 330 of the write transistor 310. In some implementations, the gate structure 412 corresponds to the gate structure 346 of the storage transistor 312.

A channel layer 414 is included over, on, and/or around the dielectric support structure 406. The channel layer 414 may be included between the gate structure 412 and the source/drain region 408, and between the gate structure 412 and the source/drain region 410. A portion of the channel layer 414 may be included over and/or on a top surface of the source/drain region 408, and another portion of the channel layer 414 may be included over and/or on a top surface of the source/drain region 410. In some implementations, the channel layer 414 corresponds to the channel layer 332 of the write transistor 310. In some implementations, the channel layer 414 corresponds to the channel layer 348 of the storage transistor 312.

A gate dielectric layer 416 may be included over and/or on the channel layer 414. The gate dielectric layer 416 may be located between the gate structure 412 and the channel layer 414. The gate dielectric layer 416 may also extend between the dielectric layer 402 and the dielectric layer 404. In some implementations, the gate dielectric layer 416 corresponds to the gate dielectric layer 334 of the write transistor 310. In some implementations, the gate dielectric layer 416 corresponds to the gate dielectric layer 350 of the storage transistor 312.

As further shown in FIG. 4A, the channel layer 414 may conform to the shape and/or contours of the dielectric support structure 406. As a result, the channel layer 414 may approximately resembles an inverted U shape, an ohm symbol (Ω) shape, or an uppercase/capital omega (Ω) shape. In the example illustrated in FIG. 4A, the channel layer 414 corresponds to an approximately squared inverted U shape, an approximately squared ohm symbol (Ω) shape, or an approximately squared uppercase/capital omega (Ω) shape, where the portions or segments of the channel layer 414 are approximately straight-lined and approximately rectangular. However, in some implementations, one or more of the portions or segments of the channel layer 414 may be rounded as a result of one or more semiconductor manufacturing operations, such that channel layer 414 corresponds to a rounded inverted U shape, a rounded ohm symbol (Ω) shape, or a rounded uppercase/capital omega (Ω) shape. A portion of the gate dielectric layer 416 over and/or on the channel layer 414 may conform to the shape of the channel layer 414, and may therefore also approximately resemble an inverted U shape, an ohm symbol (Ω) shape, or an uppercase/capital omega (Ω) shape. The gate structure 412 at least partially wraps around the channel layer 414 and at least partially around the gate dielectric layer 416 (e.g., on at least three sides of the channel layer 414 and on at least three sides of the gate dielectric layer 416).

The channel layer 414 may include a plurality of extension portions 418 and 420 that are coupled with respective ends of an inverted (or upside down) approximately U-shaped portion 422. The inverted (or upside down) approximately U-shaped portion 422 may be squared and/or straight-line, as shown in the example in FIG. 4A, or may be rounded as a result of one or more semiconductor manufacturing operations.

The inverted (or upside down) approximately U-shaped portion 422 may include an elongated portion 424, an elongated portion 426, and an elongated portion 428 coupled with the elongated portion 424 and the elongated portion 426 at opposing ends of the elongated portion 428. The elongated portion 424 may be approximately parallel with the elongated portion 426. The elongated portion 428 may be approximately perpendicular with the elongated portion 424 and the elongated portion 426.

The extension portion 418 may be located over and/or on a top surface of the source/drain region 408, and may be coupled with an end of the elongated portion 424 opposing an end of the elongated portion 424 that is coupled with the elongated portion 428. The extension portion 420 may be located over and/or on a top surface of the source/drain region 410, and may be coupled with an end of the elongated portion 426 opposing an end of the elongated portion 426 that is coupled with the elongated portion 428.

The extension portion 418 and the extension portion 420 may extend in an approximately parallel direction. The extension portion 418 and the extension portion 420 may be approximately parallel with the elongated portion 428, and may be approximately perpendicular with the elongated portion 424 and the elongated portion 426.

FIG. 4B illustrates an example flow path 430 of electrons between the source/drain region 408 and the source/drain region 410. As shown in FIG. 4B, when the gate structure 412 is energized and a conductive channel is formed in the channel layer 414, electrons are permitted to flow between the source/drain region 408 and the source/drain region 410 along the flow path 430 in the channel layer 414. In particular, the electrons may flow from the source/drain region 408 to the extension portion 418 of the channel layer 414, from the extension portion 418 of the channel layer 414 to the elongated portion 424 of the channel layer 414, from the elongated portion 424 of the channel layer 414 to the elongated portion 428 of the channel layer 414, from the elongated portion 428 of the channel layer 414 to the elongated portion 426 of the channel layer 414, from the elongated portion 426 of the channel layer 414 to the extension portion 420 of the channel layer 414, and from the extension portion 420 of the channel layer 414 to the source/drain region 410. The flow path 430 results from the specific shape of the channel layer 414, and the specific shape of the channel layer 414 (e.g., the shape that approximately resembles an inverted U shape, an ohm symbol (Ω) shape, or an uppercase/capital omega (Ω) shape) provides an increased channel length of the channel layer 414 between the source/drain region 408 and the source/drain region 410 relative to a channel layer that extends directly between the source/drain region 408 and the source/drain region 410 in a straight-line manner.

As indicated above, FIGS. 4A and 4B are provided as an example. Other examples may differ from what is described with regard to FIGS. 4A and 4B.

Figure 5:
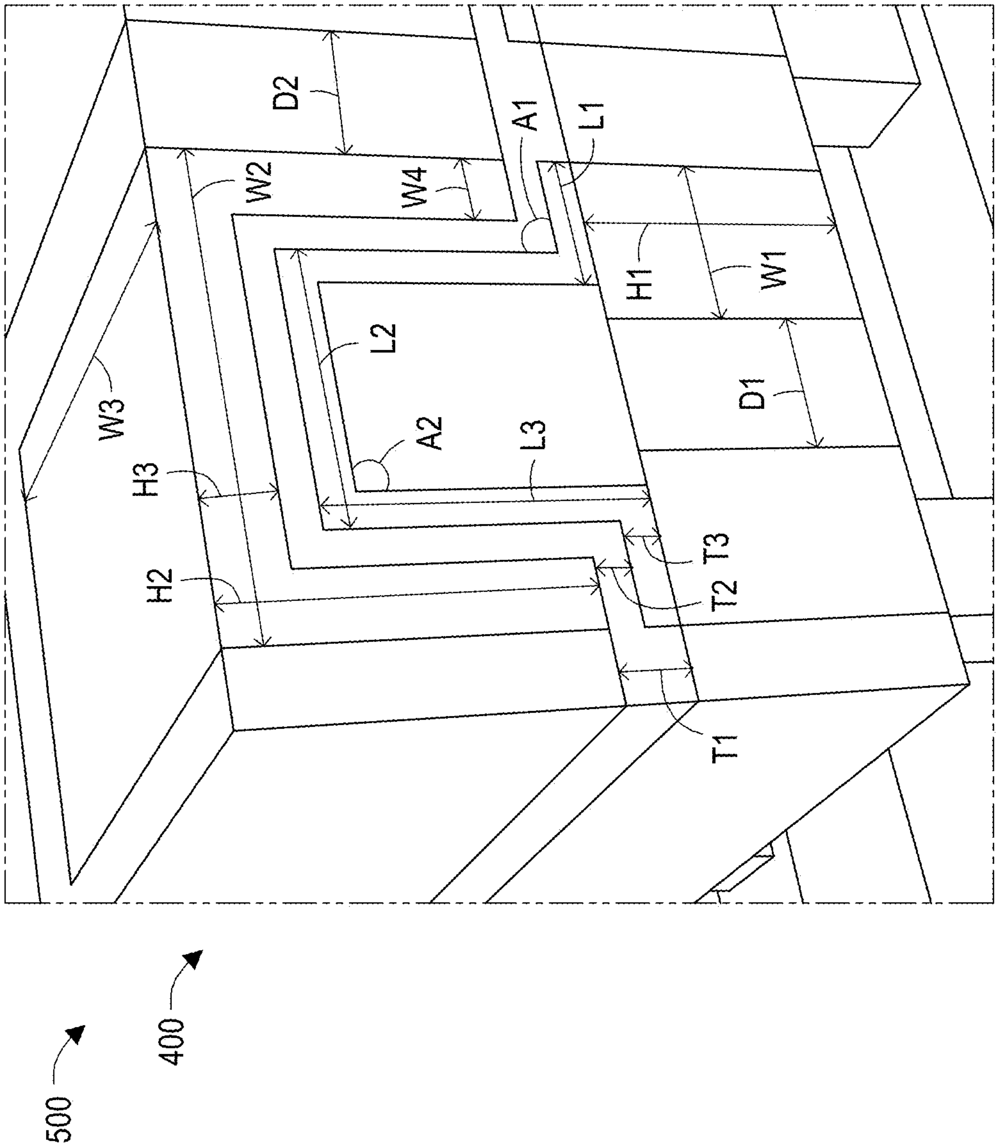

FIG. 5 is a diagram of an example implementation 500 of the transistor 400 of a memory cell structure (e.g., the memory cell structure 300, the memory cell structure 700) described herein. The example implementation 500 includes examples of dimensions of the transistor 400.

As shown in FIG. 5, an example dimension may include a height (H1) of a source/drain region (e.g., the source/drain region 408, the source/drain region 410). In some implementations, the height (H1) is included in a range of approximately 15 nanometers to approximately 40 nanometers to enable precise control of planarization of the source/drain region while minimizing the contact resistance of the source/drain region. However, other values for the range are within the scope of the present disclosure.

As further shown in FIG. 5, an example dimension may include a width (W1) of a source/drain region (e.g., the source/drain region 408, the source/drain region 410). In some implementations, the width (W1) is included in a range of approximately 10 nanometers to approximately 70 nanometers to enable precise control of deposition of the source/drain region while providing a sufficiently high current flow in the transistor 400 and minimizing the size of the transistor 400. However, other values for the range are within the scope of the present disclosure.

As further shown in FIG. 5, an example dimension may include a distance (D1) between source/drain regions (e.g., the source/drain region 408 and the source/drain region 410) of the transistor 400. In some implementations, the distance (D1) is included in a range of approximately 10 nanometers to approximately 100 nanometers to enable precise control of deposition of the source/drain regions, to minimize the likelihood of merging of the source/drain regions, and to minimize the size of the transistor 400. However, other values for the range are within the scope of the present disclosure.

As further shown in FIG. 5, an example dimension may include a distance (D2) between transistors 400. In some implementations, the distance (D2) is included in a range of approximately 10 nanometers to approximately 100 nanometers to enable precise control of formation of the transistors 400, to reduce parasitic capacitance between the transistors 400, and to minimize the size of the transistor 400. However, other values for the range are within the scope of the present disclosure.

As further shown in FIG. 5, an example dimension may include a thickness (T1) of the gate dielectric layer 416 between the dielectric layer 402 and the dielectric layer 404. In some implementations, the thickness (T1) is included in a range of approximately 3 nanometers to approximately 15 nanometers to reduce current leakage in the transistor 400, to reduce the likelihood of oxide breakdown in the transistor 400, to provide sufficient gate control in the transistor 400, and/or to provide a sufficiently high on current in the transistor 400. However, other values for the range are within the scope of the present disclosure.

As further shown in FIG. 5, an example dimension may include a thickness (T2) of the gate dielectric layer 416 on the channel layer 414 (e.g., between the channel layer 414 and the gate structure 412). In some implementations, the thickness (T2) is included in a range of approximately 3 nanometers to approximately 15 nanometers to reduce current leakage in the transistor 400, to reduce the likelihood of oxide breakdown in the transistor 400, to provide sufficient gate control in the transistor 400, and/or to provide a sufficiently high on current in the transistor 400. However, other values for the range are within the scope of the present disclosure.

As further shown in FIG. 5, an example dimension may include a thickness (T3) of the channel layer 414. In some implementations, the thickness (T3) is included in a range of approximately 3 nanometers to approximately 15 nanometers to reduce current leakage in the transistor 400, to reduce the likelihood of oxide breakdown in the transistor 400, to provide sufficient gate control in the transistor 400, and/or to provide a sufficiently high on current in the transistor 400. However, other values for the range are within the scope of the present disclosure.

As further shown in FIG. 5, an example dimension may include a length (L1) of an extension portion (e.g., an extension portion 418, an extension portion 420) of the channel layer 414. In some implementations, the length (L1) is included in a range of approximately 2 nanometers to approximately 30 nanometers to achieve a sufficiently low contact resistance for the transistor 400 while providing a sufficiently small size for the transistor 400. However, other values for the range are within the scope of the present disclosure.

As further shown in FIG. 5, an example dimension may include a length (L2) of an elongated portion (e.g., an elongated portion 428) of the channel layer 414. In some implementations, the length (L2) is included in a range of approximately 10 nanometers to approximately 150 nanometers to provide a sufficiently high on current in the transistor 400 while providing a sufficiently small size for the transistor 400. However, other values for the range are within the scope of the present disclosure.

As further shown in FIG. 5, an example dimension may include a length (L3) of an elongated portion (e.g., an elongated portion 424, an elongated portion 426) of the channel layer 414. In some implementations, the length (L3) is included in a range of approximately 50 nanometers to approximately 100 nanometers to reduce the likelihood of short channel effects (e.g., high current leakage, threshold voltage roll-off) in the transistor 400 while providing a sufficiently high on current in the transistor 400. However, other values for the range are within the scope of the present disclosure.

As further shown in FIG. 5, an example dimension may include a transition angle (A1) between an elongated portion (e.g., an elongated portion 424, an elongated portion 426) and an extension portion (e.g., an extension portion 418, and extension portion 420) of the channel layer 414. In some implementations, the transition angle (A1) is included in a range of approximately 50 degrees to approximately 90 degrees to reduce the likelihood of local current leakage in the channel layer 414 while providing sufficient etch performance for the channel layer 414. However, other values for the range are within the scope of the present disclosure.

As further shown in FIG. 5, an example dimension may include a transition angle (A2) between elongated portions (e.g., between an elongated portion 424 and an elongated portion 428, between an elongated portion 426 and an elongated portion 428) of the channel layer 414. In some implementations, the transition angle (A2) is included in a range of approximately 50 degrees to approximately 90 degrees to reduce the likelihood of local current leakage in the channel layer 414 while providing sufficient etch performance for the channel layer 414. However, other values for the range are within the scope of the present disclosure.

As further shown in FIG. 5, an example dimension may include a width (W2) of the gate structure 412 in a direction across the source/drain regions of the transistor 400. In some implementations, the width (W2) is included in a range of approximately 50 nanometers to approximately 200 nanometers to enable sufficient gap-filling performance when depositing the gate structure 412 while minimizing the size of the transistor 400. However, other values for the range are within the scope of the present disclosure.

As further shown in FIG. 5, an example dimension may include a width (W3) of the gate structure 412 in a direction along a source/drain region of the transistor 400. In some implementations, the width (W3) is included in a range of approximately 30 nanometers to approximately 300 nanometers to achieve a sufficiently high on current for the transistor 400 and minimizing the size of the transistor 400. However, other values for the range are within the scope of the present disclosure.

As further shown in FIG. 5, an example dimension may include a width (W4) of the gate structure 412 in a direction across the source/drain regions of the transistor 400, and between the gate dielectric layer 416 and the dielectric layer 404. In other words, the width (W4) corresponds to the width of the gate structure 412 along the sidewalls of the dielectric support structure 406. In some implementations, the width (W4) is included in a range of approximately 5 nanometers to approximately 50 nanometers to enable sufficient gap-filling performance when depositing the gate structure 412 while minimizing the size of the transistor 400. However, other values for the range are within the scope of the present disclosure.

As further shown in FIG. 5, an example dimension may include a height (H2) of a portion of the gate structure 412 that is above a source/drain region and not above the dielectric support structure 406. In some implementations, the height (H2) is included in a range of approximately 50 nanometers to approximately 100 nanometers to enable precise control of planarization of the gate structure 412 while reducing processing time and cost of forming the gate structure 412. However, other values for the range are within the scope of the present disclosure.

As further shown in FIG. 5, an example dimension may include a height (H3) of a portion of the gate structure 412 that is above the dielectric support structure 406. In some implementations, the height (H3) is included in a range of approximately 5 nanometers to approximately 50 nanometers to enable precise control of planarization of the gate structure 412 while reducing processing time and cost of forming the gate structure 412. However, other values for the range are within the scope of the present disclosure.

As indicated above, FIG. 5 is provided as an example. Other examples may differ from what is described with regard to FIG. 5.

FIGS. 6A-6F are diagrams of an example implementation 600 of forming the transistor 400 of a memory cell (e.g., the memory cell structure 300, the memory cell structure 700) described herein. The operations described in connection with FIGS. 6A-6F may be performed by one or more of the semiconductor processing tools 102-112 and/or by another semiconductor processing tool.

Figure 6A:
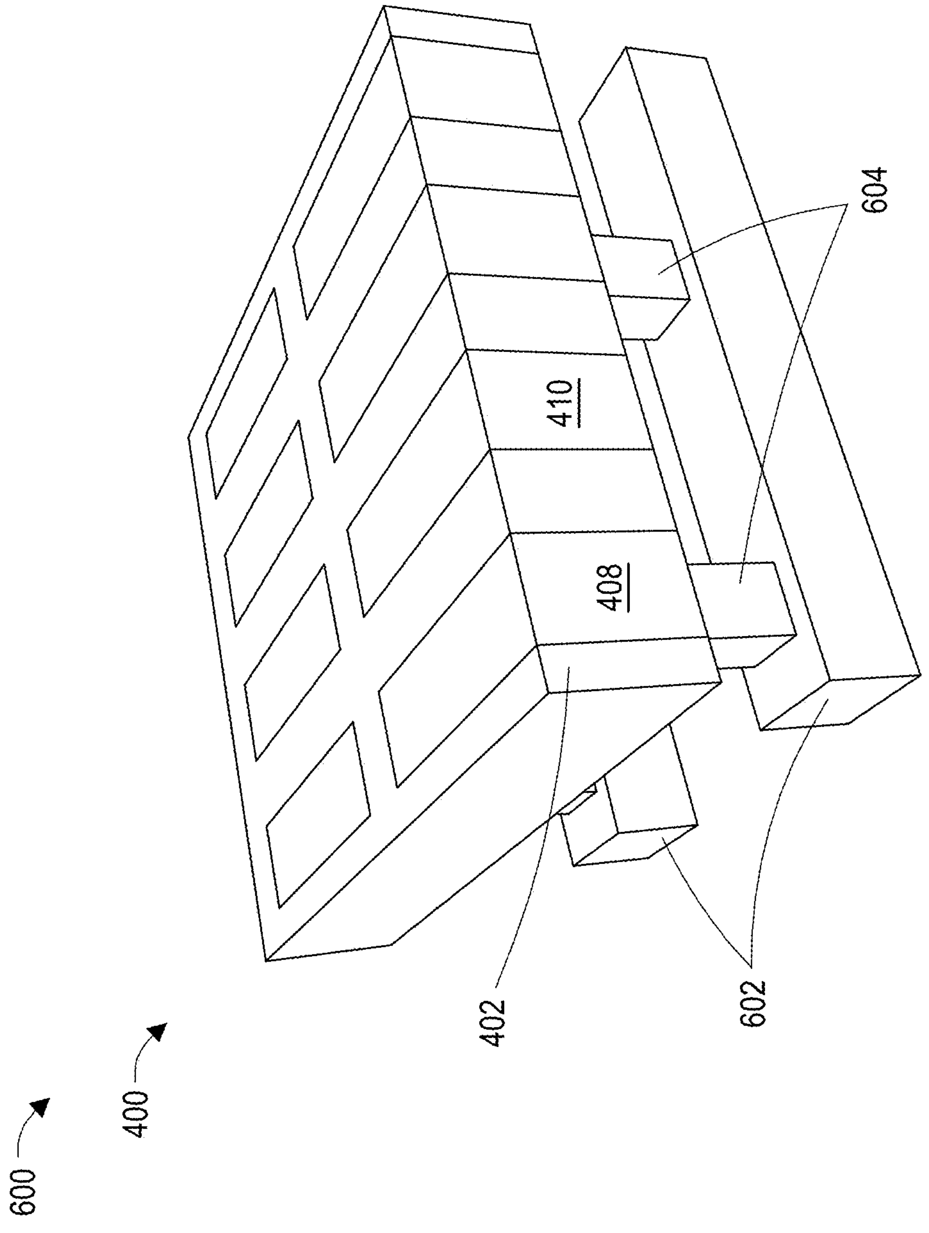
FIGS. 6A-6F are diagrams of an example implementation of forming a transistor of a memory cell described herein.

As shown in FIG. 6A, one or more conductive structures 602 may be formed. The deposition tool 102 and/or the plating tool 112 may deposit the one or more conductive structures 602 using a CVD technique, a PVD technique, an ALD technique, an electroplating technique, another deposition technique described above in connection with FIG. 1, and/or a deposition technique other than as described above in connection with FIG. 1. In some implementations, the one or more conductive structures 602 are formed in one or more dielectric layers of a semiconductor device. The one or more dielectric layers may include one or more interlayer dielectric (ILD) layers, one or more intermetal dielectric (AVID) layers, and/or one or more etch stop layers, among other examples.

As further shown in FIG. 6A, one or more interconnect structures 604 may be formed over and/or on the one or more conductive structures 602 such that the one or more interconnect structures 604 are coupled with (or electrically and/or physically connected with) the one or more conductive structures 602. The deposition tool 102 and/or the plating tool 112 may deposit the one or more interconnect structures 604 using a CVD technique, a PVD technique, an ALD technique, an electroplating technique, another deposition technique described above in connection with FIG. 1, and/or a deposition technique other than as described above in connection with FIG. 1. In some implementations, the one or more interconnect structures 604 are formed in one or more dielectric layers of a semiconductor device. The one or more dielectric layers may include one or more ILD layers, one or more IMD layers, and/or one or more etch stop layers, among other examples.

In some implementations, the one or more conductive structures 602 may correspond to a write bit line conductive structure 304, a read word line conductive structure 306, a read bit line conductive structure 308, and/or a ground conductive structure 316, among other examples. In some implementations, the one or more interconnect structures 604 may correspond to one or more interconnect structures 318.

As further shown in FIG. 6A, a dielectric layer 402 may be formed above and/or over the one or more conductive structures 602 and/or the one or more interconnect structures 604. The deposition tool 102 may deposit the dielectric layer 402 using a CVD technique, a PVD technique, an ALD technique, another deposition technique described above in connection with FIG. 1, and/or a deposition technique other than as described above in connection with FIG. 1.

As further shown in FIG. 6A, source/drain regions 408 and 410 may be formed in the dielectric layer 402. In some implementations, a pattern in a photoresist layer is used to form openings in the dielectric layer 402. In these implementations, the deposition tool 102 forms the photoresist layer on the dielectric layer 402. The exposure tool 104 exposes the photoresist layer to a radiation source to pattern the photoresist layer. The developer tool 106 develops and removes portions of the photoresist layer to expose the pattern. The etch tool 108 etches into the dielectric layer 402 to form the openings. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the openings based on a pattern.

The deposition tool 102 may deposit the source/drain regions 408 and 410 into the openings using an epitaxy technique, a CVD technique, a PVD technique, an ALD technique, another deposition technique described above in connection with FIG. 1, and/or a deposition technique other than as described above in connection with FIG. 1. The source/drain region 408 may be formed such that the source/drain region 408 is connected to an interconnect structure 604 that is connected to a conductive structure 602 (e.g., a ground conductive structure or another type of conductive structure). In some implementations, the planarization tool 110 may perform a CMP operation to planarize the source/drain regions 408 and 410 after the source/drain regions 408 and 410 are deposited.

Figure 6B:
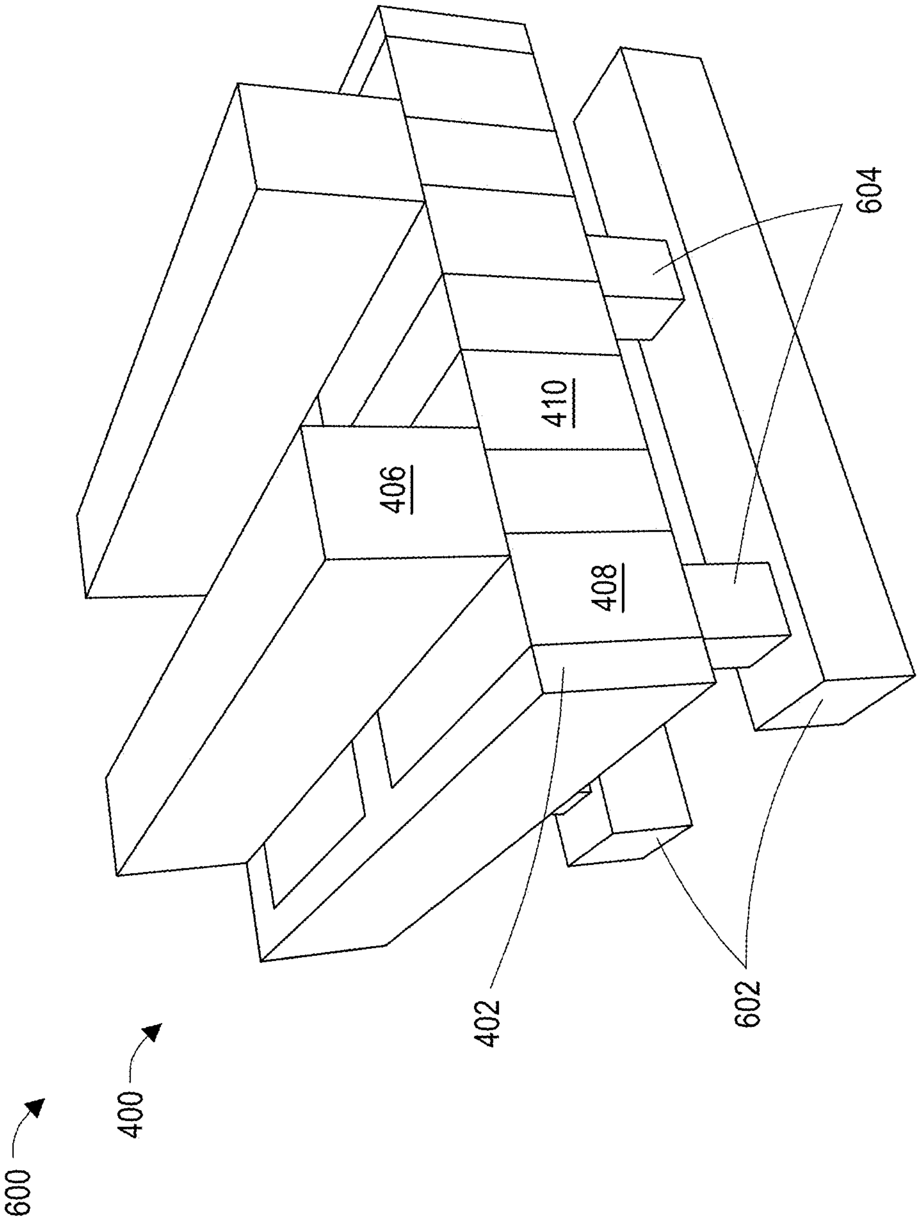

As shown in FIG. 6B, a dielectric support structure 406 may be formed over and/or on the dielectric layer 402, over and/or on the source/drain region 408, and/or over and/or on the source/drain region 410. The dielectric support structure 406 may be formed between the source/drain region 408 and the source/drain region 410, and may partially overlap the top surfaces of the source/drain region 408 and the source/drain region 410. The deposition tool 102 may deposit the dielectric support structure 406 using a CVD technique, a PVD technique, an ALD technique, another deposition technique described above in connection with FIG. 1, and/or a deposition technique other than as described above in connection with FIG. 1.

In some implementations, a blanket layer of dielectric material is deposited, and the blanket layer is etched back such that remaining portions of the blanket layer correspond to the dielectric support structure 406. In these implementations, the deposition tool 102 forms the photoresist layer on the blanket layer. The exposure tool 104 exposes the photoresist layer to a radiation source to pattern the photoresist layer. The developer tool 106 develops and removes portions of the photoresist layer to expose the pattern. The etch tool 108 etches into the blanket layer to remove portions of the blanket layer. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the dielectric support structure 406 based on a pattern.

Figure 6C:
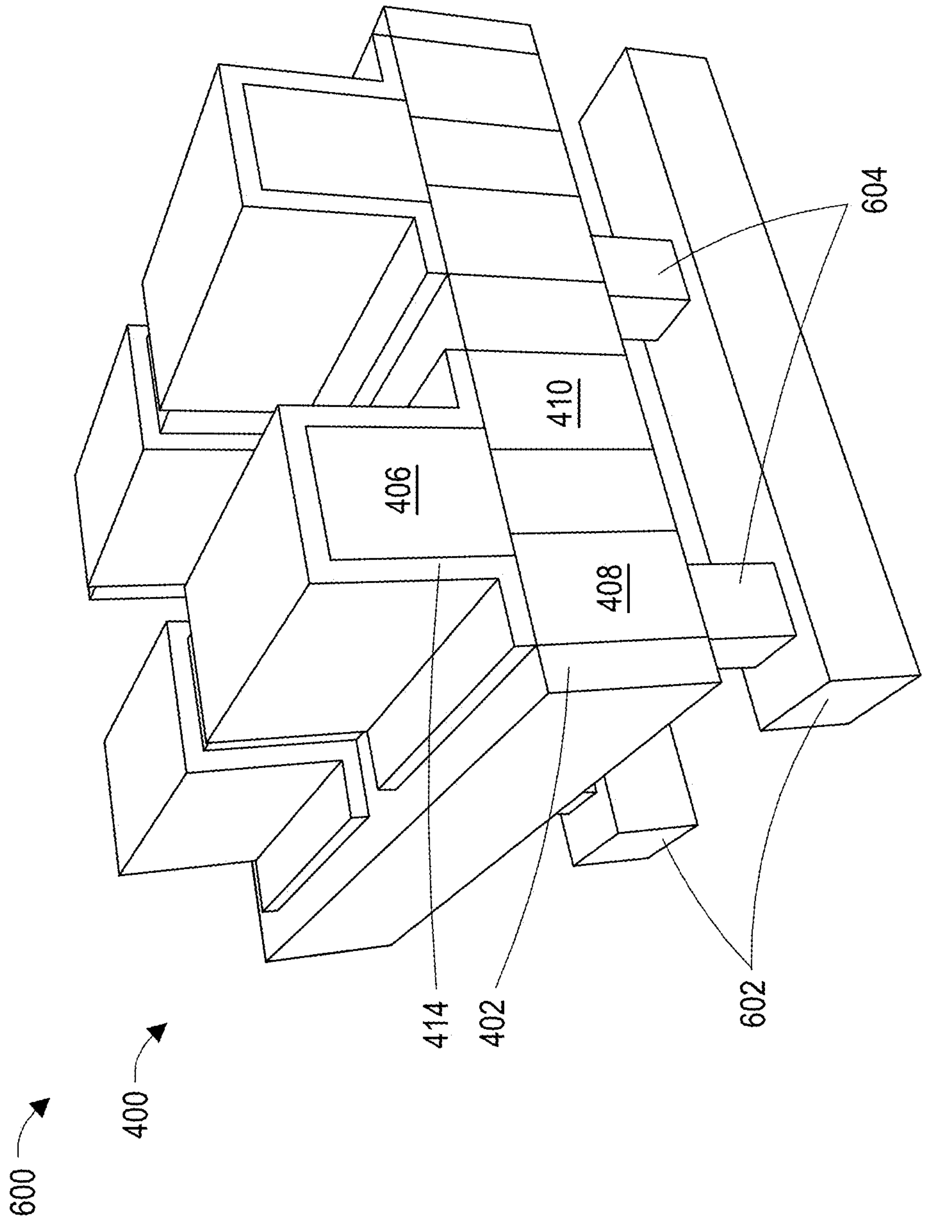

As shown in FIG. 6C, a channel layer 414 may be formed over and/or on the dielectric support structure 406, over and/or on the top surface of the source/drain region 408, and/or over and/or on the top surface of the source/drain region 410. The deposition tool 102 may deposit the channel layer 414 using a CVD technique, a PVD technique, an ALD technique, another deposition technique described above in connection with FIG. 1, and/or a deposition technique other than as described above in connection with FIG. 1. Moreover, the deposition tool 102 may deposit the channel layer 414 by conformal deposition such that the shape of the channel layer 414 conforms to the shape of the dielectric support structure 406. In this way, the channel layer 414 wraps around three sides of the dielectric support structure 406 and approximately resembles an inverted U shape, an ohm symbol (Ω) shape, or an uppercase/capital omega (Ω) shape. Moreover, the channel layer 414 extends over the top surfaces of the source/drain regions 408 and 410.

In some implementations, a blanket layer of channel material is deposited, and the blanket layer is etched back such that remaining portions of the blanket layer correspond to the channel layer 414. In these implementations, the deposition tool 102 forms the photoresist layer on the blanket layer channel material. The exposure tool 104 exposes the photoresist layer to a radiation source to pattern the photoresist layer. The developer tool 106 develops and removes portions of the photoresist layer to expose the pattern. The etch tool 108 performs an etch back operation to remove portions of the channel material, where remaining portions of the channel material over the dielectric support structure 406 and over the source/drain regions 408 and 410 correspond to the channel layer 414. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the channel layer 414 based on a pattern. In this way, the channel layer 414 is electrically isolated from other channel layers.

Figure 6D:
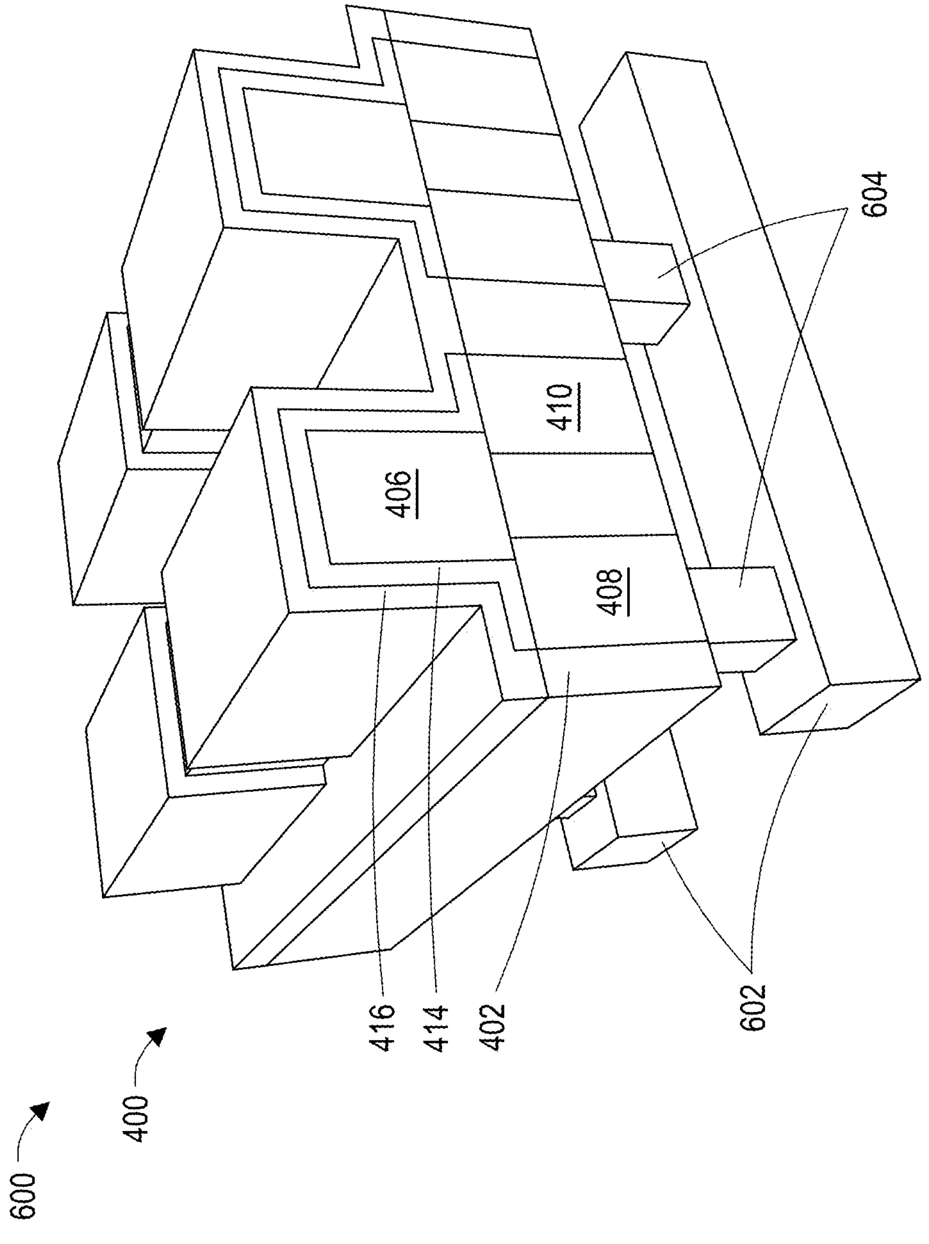

As shown in FIG. 6D, a gate dielectric layer 416 may be formed over and/or on the channel layer 414. Moreover, the gate dielectric layer 416 may be formed over and/or on exposed portions of the dielectric layer 402. The deposition tool 102 may deposit the gate dielectric layer 416 using a CVD technique, a PVD technique, an ALD technique, another deposition technique described above in connection with FIG. 1, and/or a deposition technique other than as described above in connection with FIG. 1. Moreover, the deposition tool 102 may deposit the gate dielectric layer 416 by conformal deposition such that the shape of the gate dielectric layer 416 conforms to the shape of the channel layer 414 and the dielectric support structure 406. In this way, the gate dielectric layer 416 wraps around three sides of the dielectric support structure 406 and approximately resembles an inverted U shape, an ohm symbol (Ω) shape, or an uppercase/capital omega (Ω) shape.

Figure 6E:
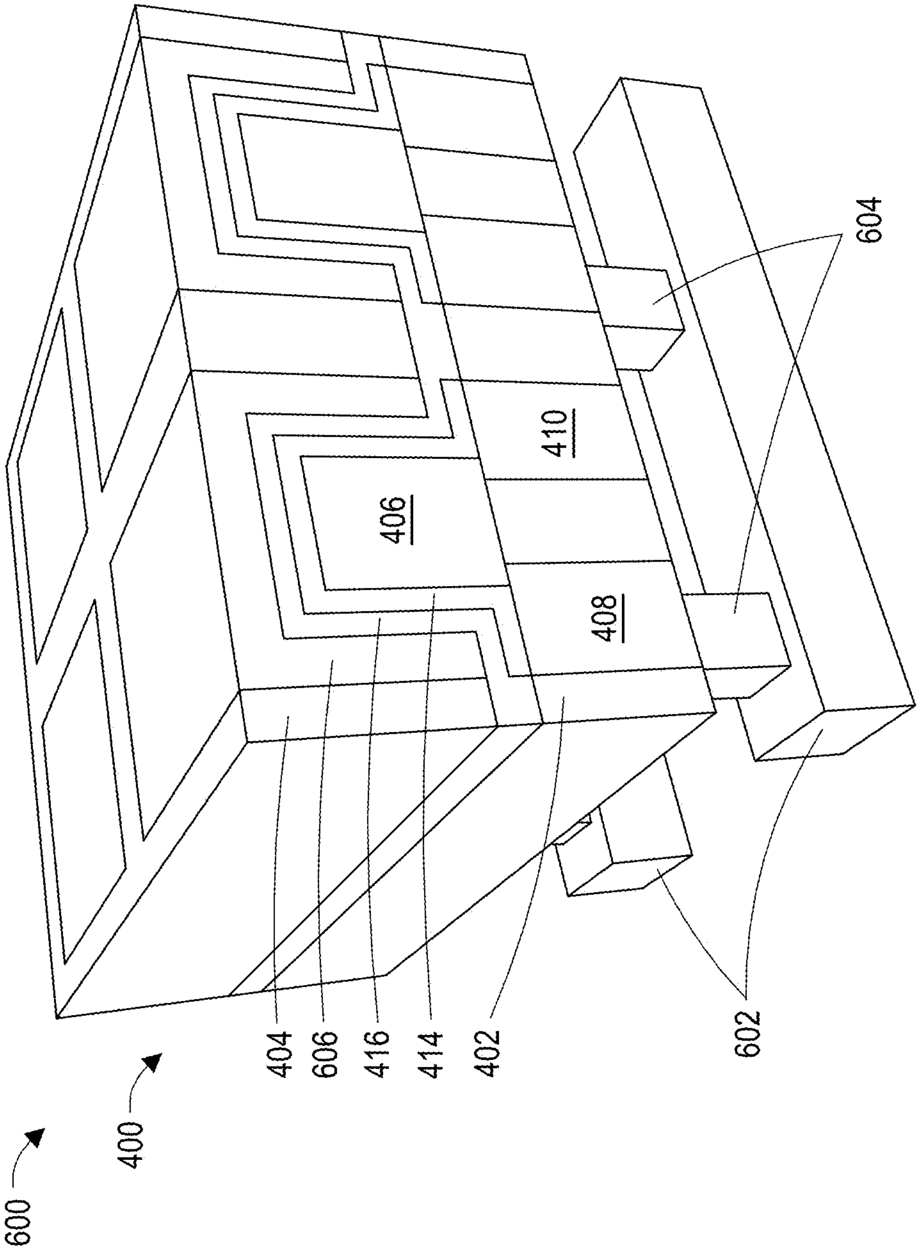

As shown in FIG. 6E, a spacer layer 606 may be formed over the gate dielectric layer 416. Moreover, a dielectric layer 404 may be formed over and/or on the dielectric layer 402. The deposition tool 102 may deposit the dielectric layer 404 and the spacer layer 606 using a CVD technique, a PVD technique, an ALD technique, another deposition technique described above in connection with FIG. 1, and/or a deposition technique other than as described above in connection with FIG. 1.

The spacer layer 606 may be formed prior to formation of the dielectric layer 404, and the dielectric layer 404 may be formed around the spacer layer 606. In this way, the spacer layer 606 may cover the areas of the transistor 400 over the channel layer 414 to leave space for formation of a gate structure 412 over the channel layer 414. In some implementations, the planarization tool 110 may perform a CMP operation to planarize the dielectric layer 404.

Alternatively, the dielectric layer 404 may be formed prior to formation of the spacer layer 606, and a pattern in a photoresist layer is used to form openings in the dielectric layer 404. In these implementations, the deposition tool 102 forms the photoresist layer on the dielectric layer 404. The exposure tool 104 exposes the photoresist layer to a radiation source to pattern the photoresist layer. The developer tool 106 develops and removes portions of the photoresist layer to expose the pattern. The etch tool 108 etches into the dielectric layer 404 to form the openings. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the openings based on a pattern. The spacer layer 606 may then be formed in the openings in the dielectric layer 404. The openings may be formed over and around the sidewalls of the dielectric support structure 406. In this way, the spacer layer 606 may be formed over the channel layer 414 and the portion of the gate dielectric layer 416 that is over the channel layer 414. In some implementations, the etch tool 108 may trim the spacer layer 606 such that only portions of the spacer layer 606 remain as gate spacers for the transistor 400.

Figure 6F:
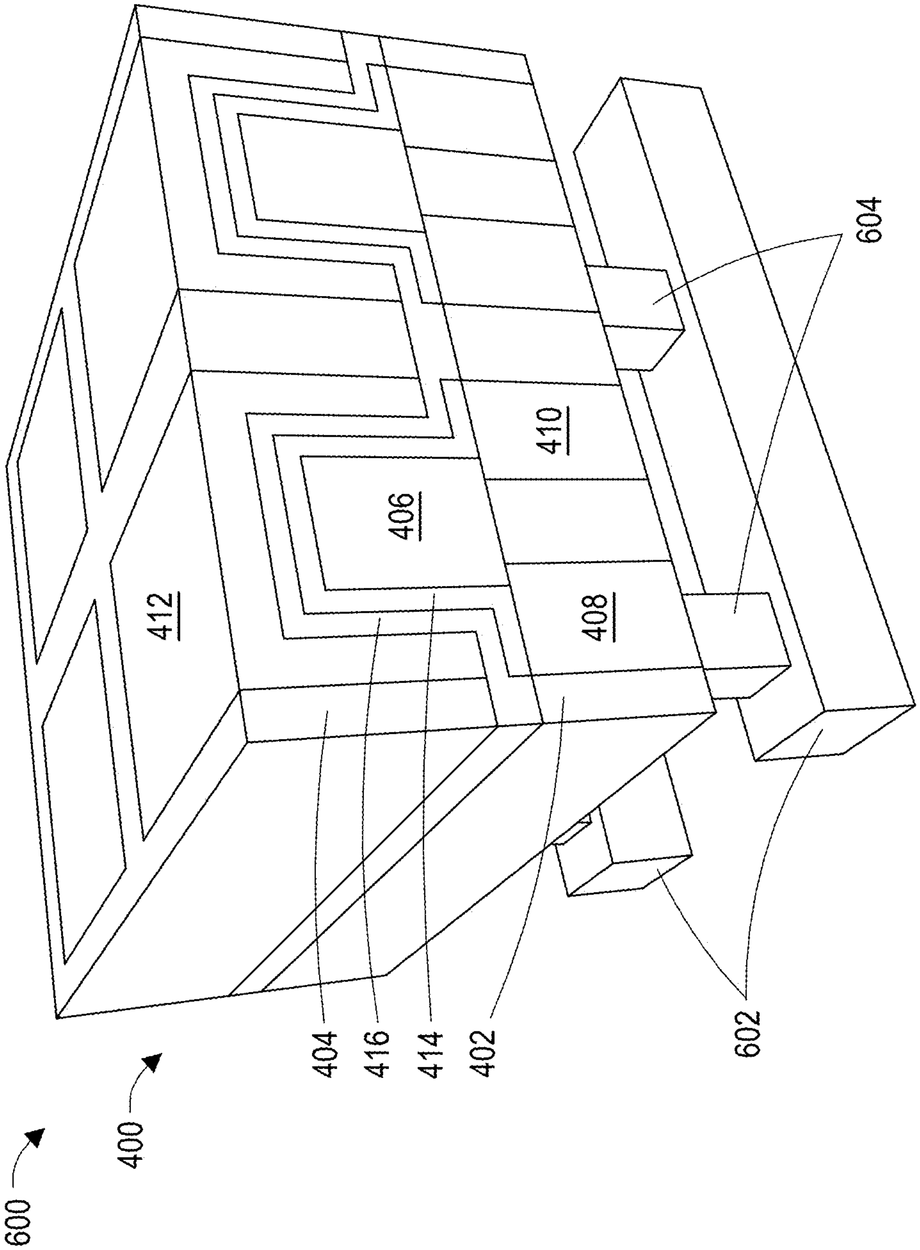

As shown in FIG. 6F, a gate structure 412 may be formed in the dielectric layer 404. The gate structure 412 may be formed over and/or on the spacer layer 606, over and/or on the gate dielectric layer 416, and/or over the channel layer 414. The deposition tool 102 and/or the plating tool 112 may deposit the gate structure 412 using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the gate structure 412.

As indicated above, FIGS. 6A-6F are provided as an example. Other examples may differ from what is described with regard to FIGS. 6A-6F.

Figure 7:
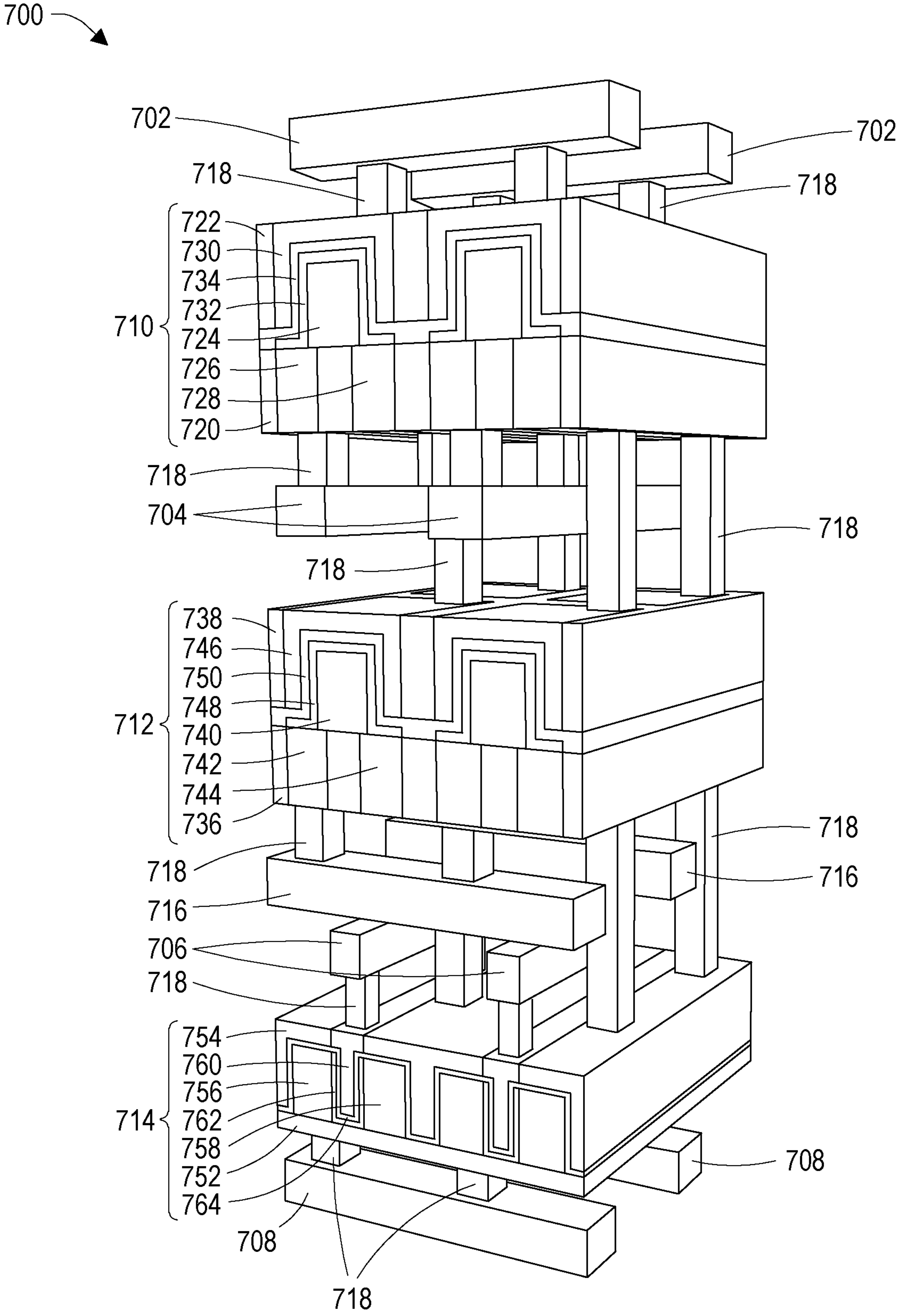
FIG. 7 is a diagram of an example memory cell structure described herein.

FIG. 7 is a diagram of an example memory cell structure 700 described herein. The circuit diagram of a memory cell 200 may be physically implemented as the memory cell structure 700. Accordingly, the memory cell structure 700 may include capacitorless memory cell structure (e.g., a capacitorless 3T DRAM cell structure and/or another type of capacitorless memory cell structure) that includes a plurality of transistors.

The memory cell structure 700 illustrated in FIG. 7 may be similar to the memory cell structure 300 illustrated in FIG. 3. Accordingly, the components 702-764 of the memory cell structure 700 may be similar to the components 302-364 of the memory cell structure 300. The write transistor 710 and/or the storage transistor 712 may be implemented as a transistor 400 described herein. However, the read transistor 714 in the memory cell structure 700 may include a "top gate" thin film transistor. Accordingly, the locations of the read word line conductive structure 706 and the read bit line conductive structure 708 in the memory cell structure 700 may be reversed relative to the locations of the read word line conductive structure 306 and the read bit line conductive structure 308 in the memory cell structure 300. In particular, the read word line conductive structure 706 may be located above and/or over the read transistor 714, and the read transistor 714 may be located below and/or under the read word line conductive structure 706. The read bit line conductive structure 708 may be located below and/or under the read transistor 714, and the read transistor 714 may be located above and/or over the read word line conductive structure 706.

Moreover, the gate structure 760 of the read transistor 714 is located between the source/drain region 756 and the source/drain region 758 of the read transistor 714. The channel layer 762 of the read transistor 714 may wrap around at least three sides of the gate structure 760, as shown in the example in FIG. 7. The channel layer 762 may be located between the gate structure 760 and the source/drain region 756, and between the gate structure 760 and the second source/drain region 758. Moreover, the channel layer 762 may wrap around a dielectric fin structure (not shown) between the source/drain region 756 and the source/drain region 758.

As indicated above, FIG. 7 is provided as an example. Other examples may differ from what is described with regard to FIG. 7.

FIGS. 8A-8G are diagrams of an example implementation 800 of forming the read transistor 714 of the memory cell structure 700 described herein. The operations described in connection with FIGS. 8A-8G may be performed by one or more of the semiconductor processing tools 102-112 and/or by another semiconductor processing tool.

Figure 8A:
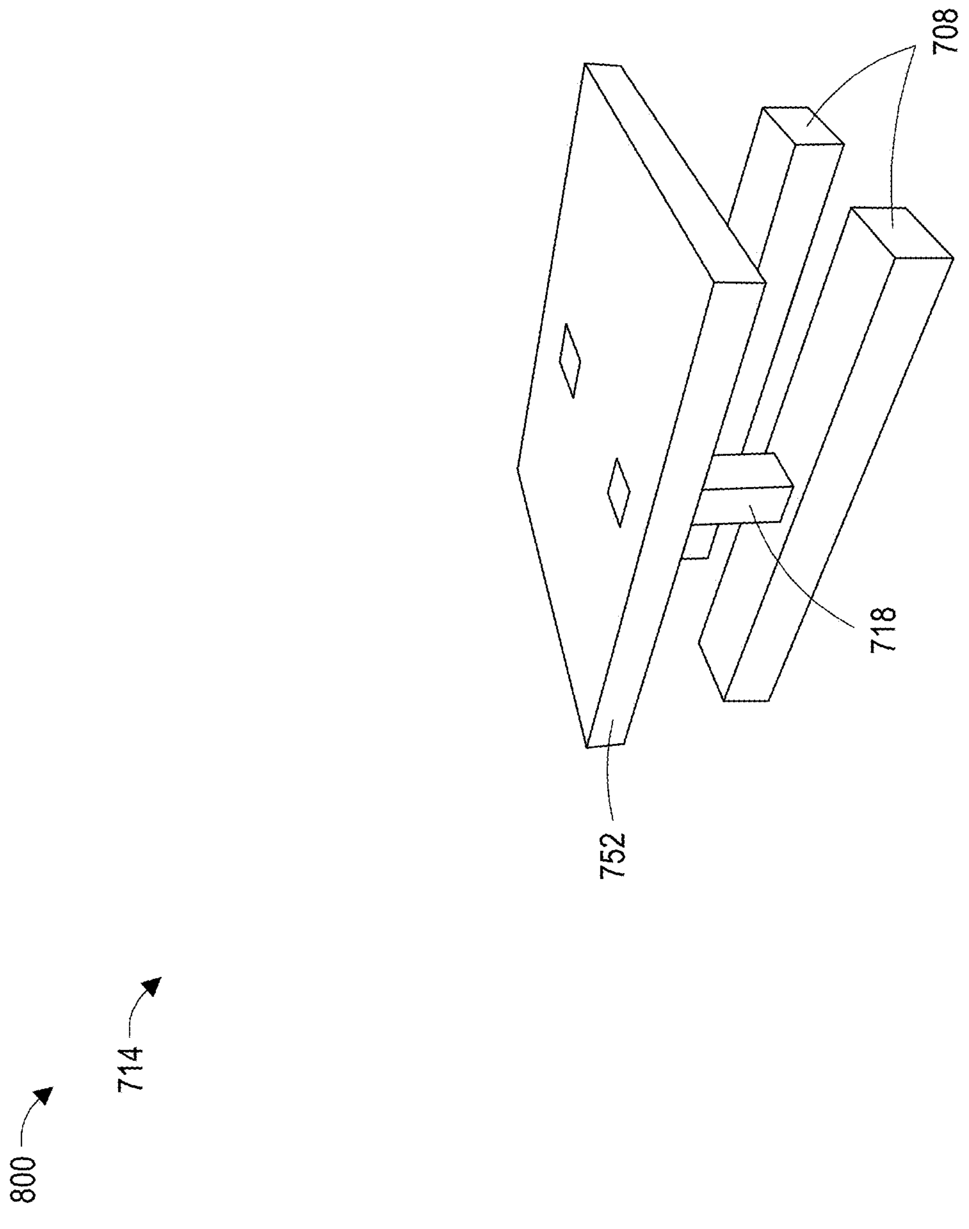
FIGS. 8A-8G are diagrams of an example implementation of forming a transistor of a memory cell described herein.

As shown in FIG. 8A, read bit line conductive structures 708 may be formed. The deposition tool 102 and/or the plating tool 112 may deposit the read bit line conductive structures 708 using a CVD technique, a PVD technique, an ALD technique, an electroplating technique, another deposition technique described above in connection with FIG. 1, and/or a deposition technique other than as described above in connection with FIG. 1. In some implementations, the read bit line conductive structures 708 are formed in one or more dielectric layers of a semiconductor device. The one or more dielectric layers may include one or more ILD layers, one or more IMD layers, and/or one or more etch stop layers, among other examples.

As further shown in FIG. 8A, one or more interconnect structures 718 may be formed over and/or on the read bit line conductive structures 708 such that the read bit line conductive structures 708 are coupled with (or electrically and/or physically connected with) the one or more interconnect structures 718. The deposition tool 102 and/or the plating tool 112 may deposit the one or more interconnect structures 718 using a CVD technique, a PVD technique, an ALD technique, an electroplating technique, another deposition technique described above in connection with FIG. 1, and/or a deposition technique other than as described above in connection with FIG. 1. In some implementations, the one or more interconnect structures 718 are formed in one or more dielectric layers of a semiconductor device. The one or more dielectric layers may include one or more ILD layers, one or more IMD layers, and/or one or more etch stop layers, among other examples.

As further shown in FIG. 8A, a dielectric layer 752 may be formed above and/or over the read bit line conductive structures 708 and/or the one or more interconnect structures 718. The deposition tool 102 may deposit the dielectric layer 752 using a CVD technique, a PVD technique, an ALD technique, another deposition technique described above in connection with FIG. 1, and/or a deposition technique other than as described above in connection with FIG. 1.

Figure 8B:
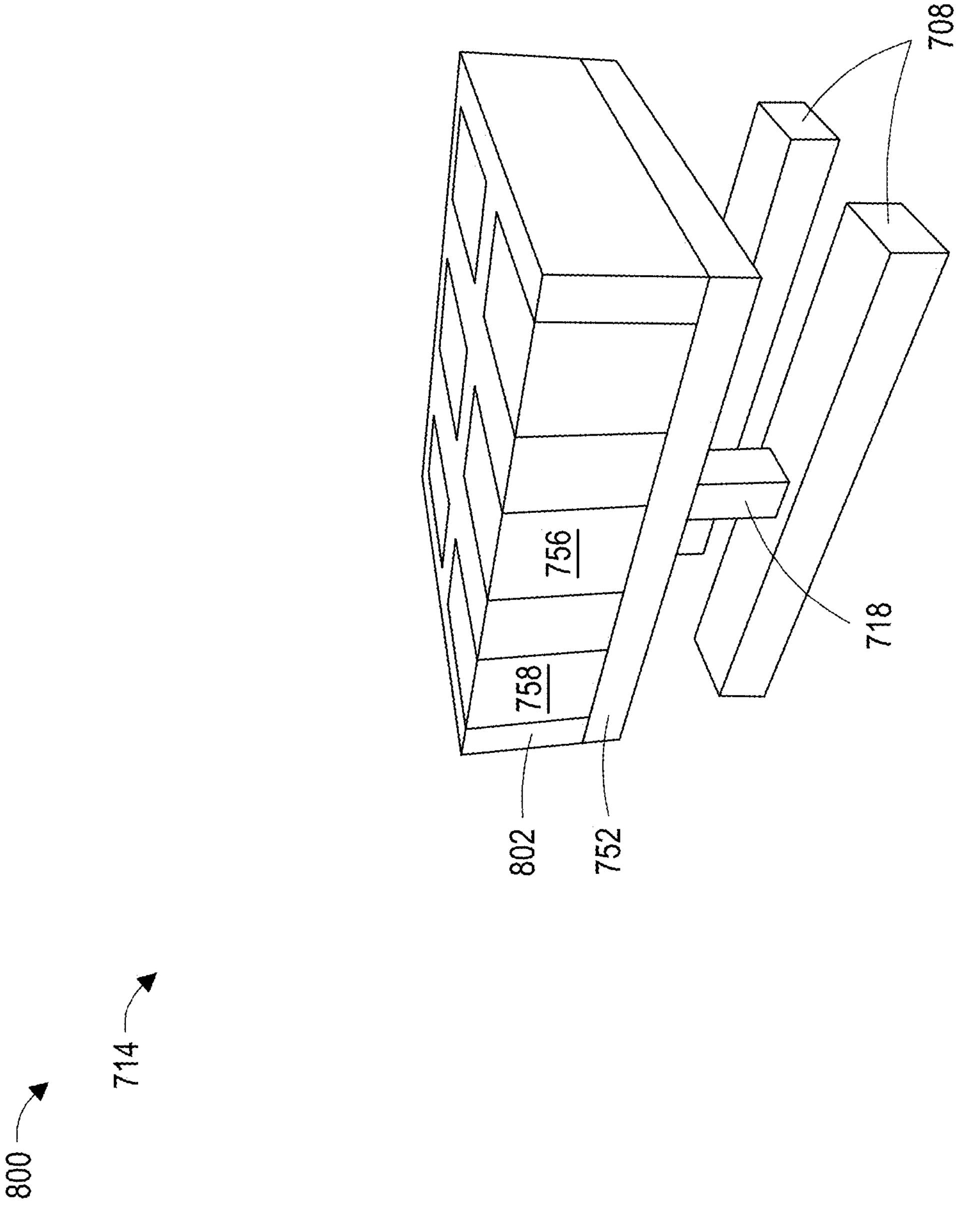

As shown in FIG. 8B, a dielectric layer 802 may be formed over and/or on dielectric layer 752. The deposition tool 102 may deposit the dielectric layer 802 using a CVD technique, a PVD technique, an ALD technique, another deposition technique described above in connection with FIG. 1, and/or a deposition technique other than as described above in connection with FIG. 1.

As further shown in FIG. 8B, source/drain regions 756 and 758 may be formed in the dielectric layer 802. In some implementations, a pattern in a photoresist layer is used to form openings in the dielectric layer 802. In these implementations, the deposition tool 102 forms the photoresist layer on the dielectric layer 802. The exposure tool 104 exposes the photoresist layer to a radiation source to pattern the photoresist layer. The developer tool 106 develops and removes portions of the photoresist layer to expose the pattern. The etch tool 108 etches into the dielectric layer 802 to form the openings. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique).

In some implementations, a hard mask layer is used as an alternative technique for forming the openings based on a pattern.

The deposition tool 102 may deposit the source/drain regions 758 and 758 into the openings using an epitaxy technique, a CVD technique, a PVD technique, an ALD technique, another deposition technique described above in connection with FIG. 1, and/or a deposition technique other than as described above in connection with FIG. 1. The source/drain region 756 may be formed such that the source/drain region 756 is connected to an interconnect structure 718 that is connected to a read bit line conductive structure 708. In some implementations, the planarization tool 110 may perform a CMP operation to planarize the source/drain regions 756 and 758 after the source/drain regions 756 and 758 are deposited.

Figure 8C:
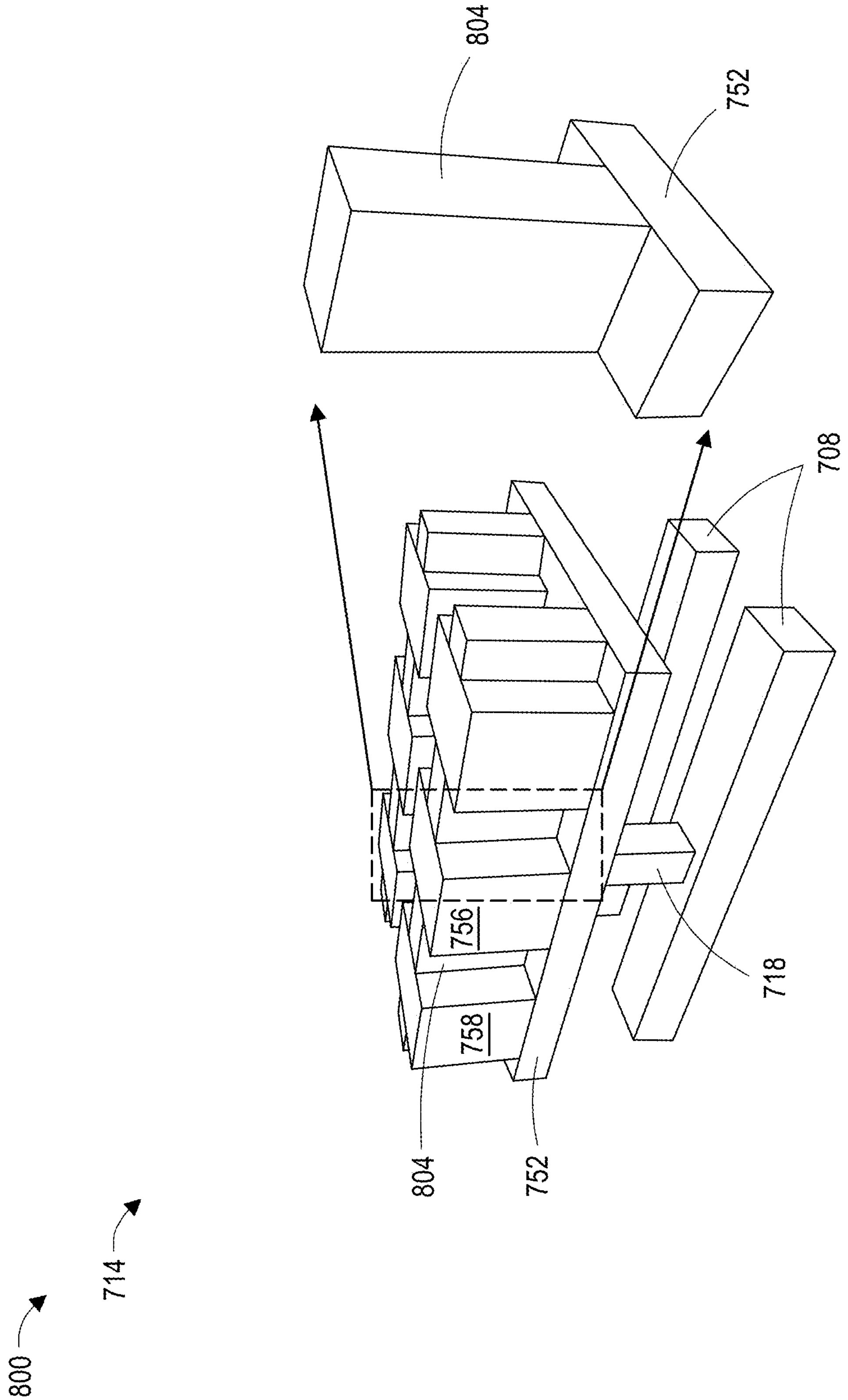

As shown in FIG. 8C, the dielectric layer 802 may be etched back to form dielectric fin structures 804 that extend between the source/drain regions 756 and 758. In some implementations, the deposition tool 102 forms the photoresist layer on the dielectric layer 802 and/or on the source/drain regions 756 and 758. The exposure tool 104 exposes the photoresist layer to a radiation source to pattern the photoresist layer. The developer tool 106 develops and removes portions of the photoresist layer to expose the pattern. The etch tool 108 etches into the dielectric layer 802 to remove portions of the dielectric layer 802 such that the remaining portions of the dielectric layer 802 correspond to the dielectric fin structures 804. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the dielectric fin structures 804 based on a pattern.

Figure 8D:
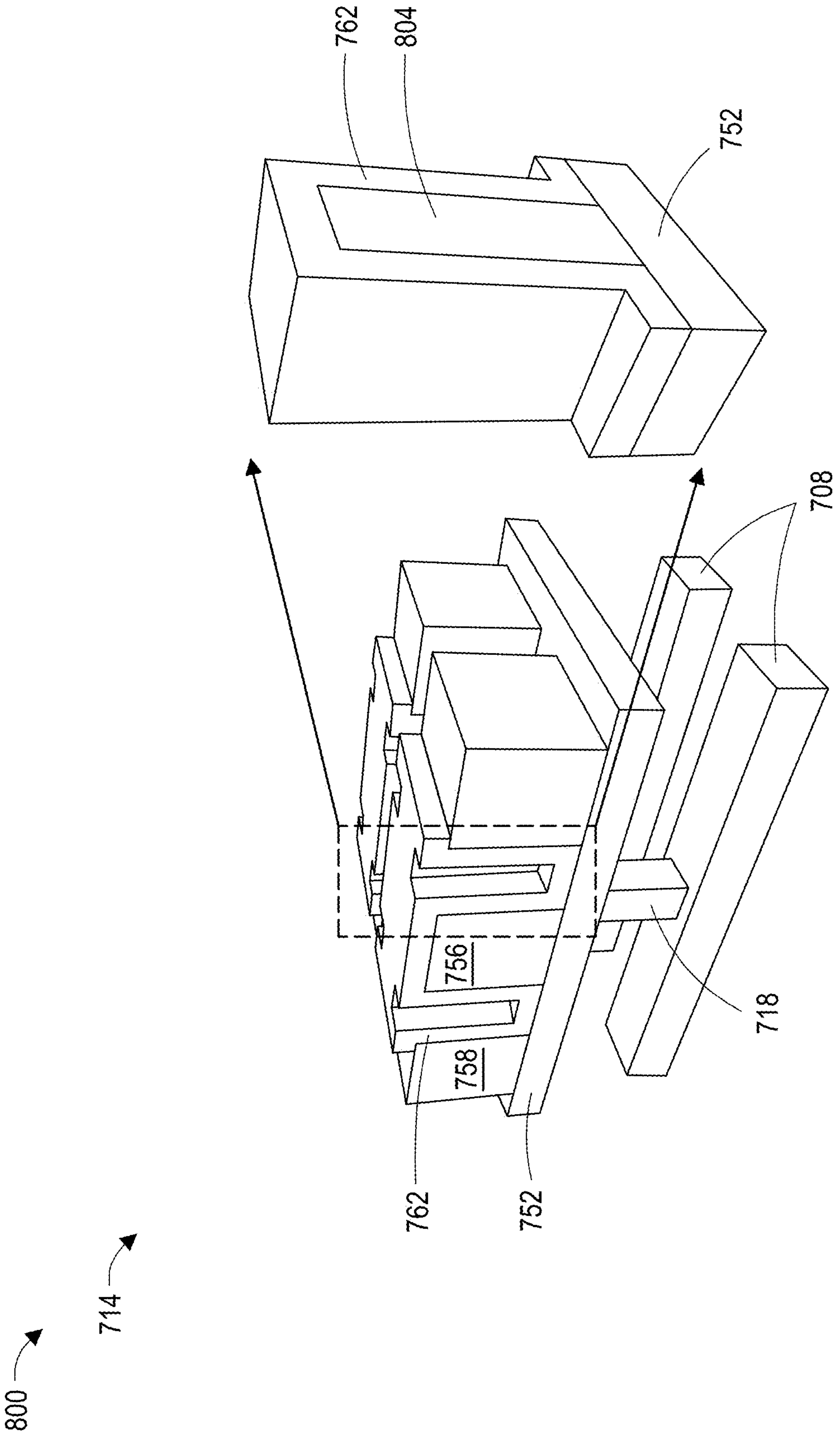

As shown in FIG. 8D, a channel layer 762 may be formed over and/or on the dielectric fin structures 804, over and/or on the top surface of the source/drain region 756, over and/or on the top surface of the source/drain region 758, over and/or on the sidewalls of the source/drain regions 756 and 758, and over and/or on a portion of the dielectric layer 752 between the source/drain regions 756 and 758. The deposition tool 102 may deposit the channel layer 762 using a CVD technique, a PVD technique, an ALD technique, another deposition technique described above in connection with FIG. 1, and/or a deposition technique other than as described above in connection with FIG. 1. Moreover, the deposition tool 102 may deposit the channel layer 762 by conformal deposition such that the shape of the channel layer 762 conforms to the shape of the dielectric fin structures 804. In particular, and as shown in a close-up view in FIG. 8D, the channel layer 762 may wrap around a dielectric fin structure 804 on three sides of the dielectric fin structure 804. Moreover, the channel layer 762 may include an approximate inverted U-shaped portion between the source/drain regions 756 and 756 in an area of the read transistor 714 adjacent to the dielectric fin structure 804. This specific shape of the channel layer 762 may provide increased read speed and increased on current to achieve increased read speeds.

Figure 8E:
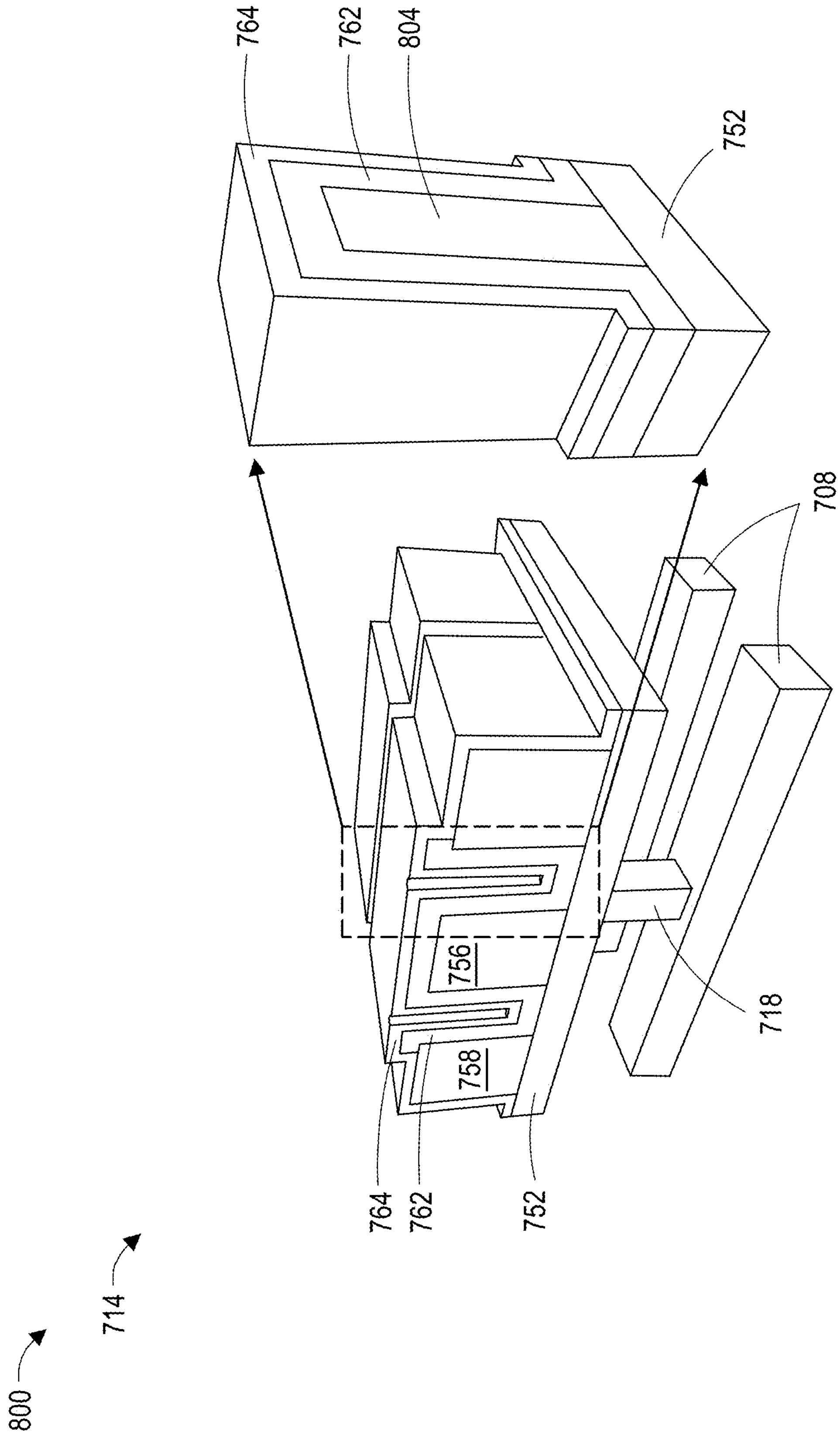

As shown in FIG. 8E, a gate dielectric layer 764 may be formed over and/or on the channel layer 762. Moreover, the gate dielectric layer 764 may be formed over and/or on exposed portions of the dielectric layer 752 and the source/drain regions 756 and 758. The deposition tool 102 may deposit the gate dielectric layer 764 using a CVD technique, a PVD technique, an ALD technique, another deposition technique described above in connection with FIG. 1, and/or a deposition technique other than as described above in connection with FIG. 1. Moreover, the deposition tool 102 may deposit the gate dielectric layer 764 by conformal deposition such that the shape of the gate dielectric layer 764 conforms to the shape of the channel layer 762.

Figure 8F:
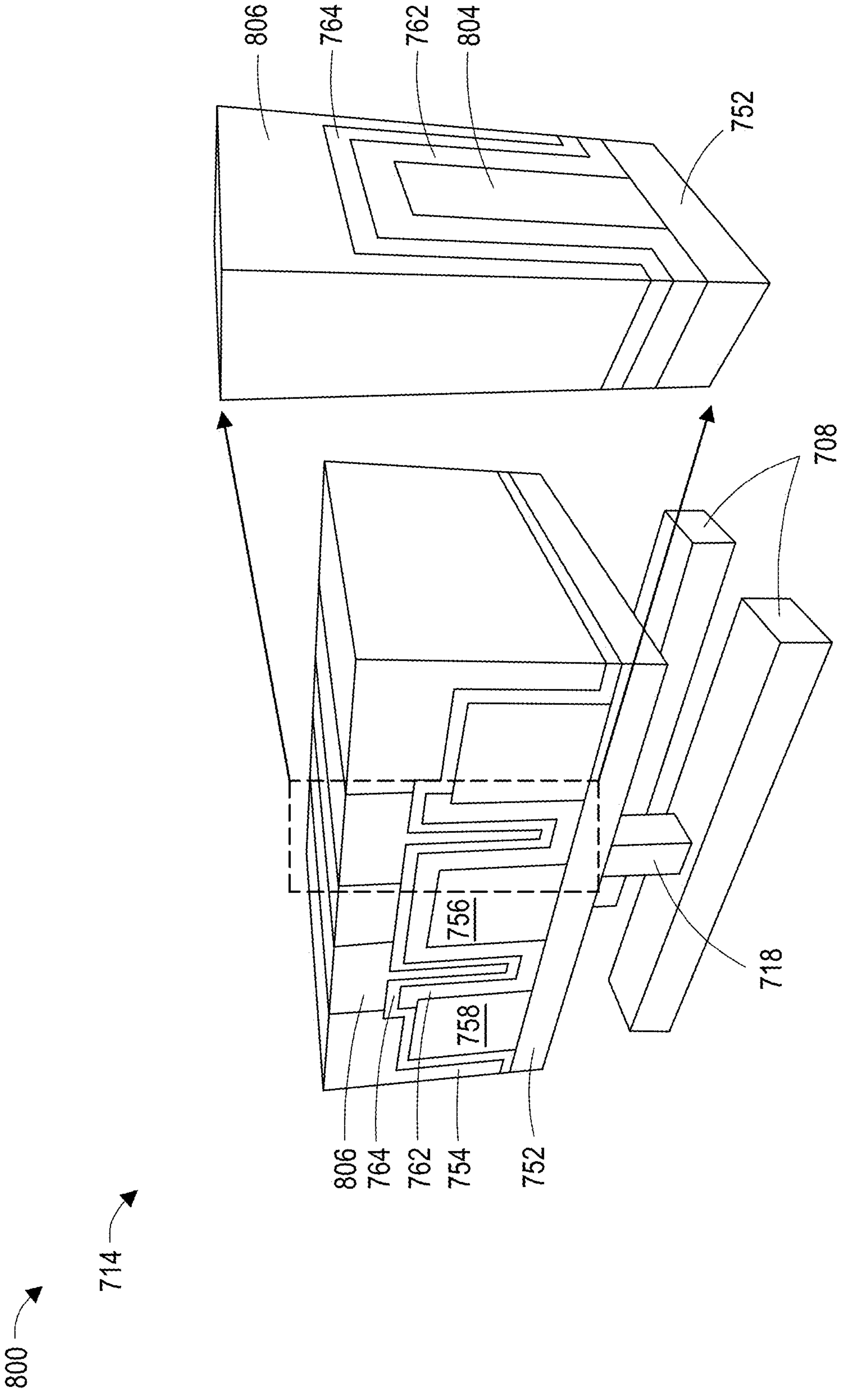

As shown in FIG. 8F, a spacer layer 806 may be formed over the gate dielectric layer 764 in portions of the read transistor 714 between the source/drain regions 756 and 758. Moreover, a dielectric layer 754 may be formed over and/or on the gate dielectric layer 764. The deposition tool 102 may deposit the dielectric layer 754 and the spacer layer 806 using a CVD technique, a PVD technique, an ALD technique, another deposition technique described above in connection with FIG. 1, and/or a deposition technique other than as described above in connection with FIG. 1.

The spacer layer 806 may be formed prior to formation of the dielectric layer 754, and the dielectric layer 754 may be formed around the spacer layer 806. In this way, the spacer layer 806 may cover the areas of the read transistor 714 over the channel layer 762 to leave space for formation of a gate structure 760 over the channel layer 762. In some implementations, the planarization tool 110 may perform a CMP operation to planarize the dielectric layer 754.

Figure 8G:
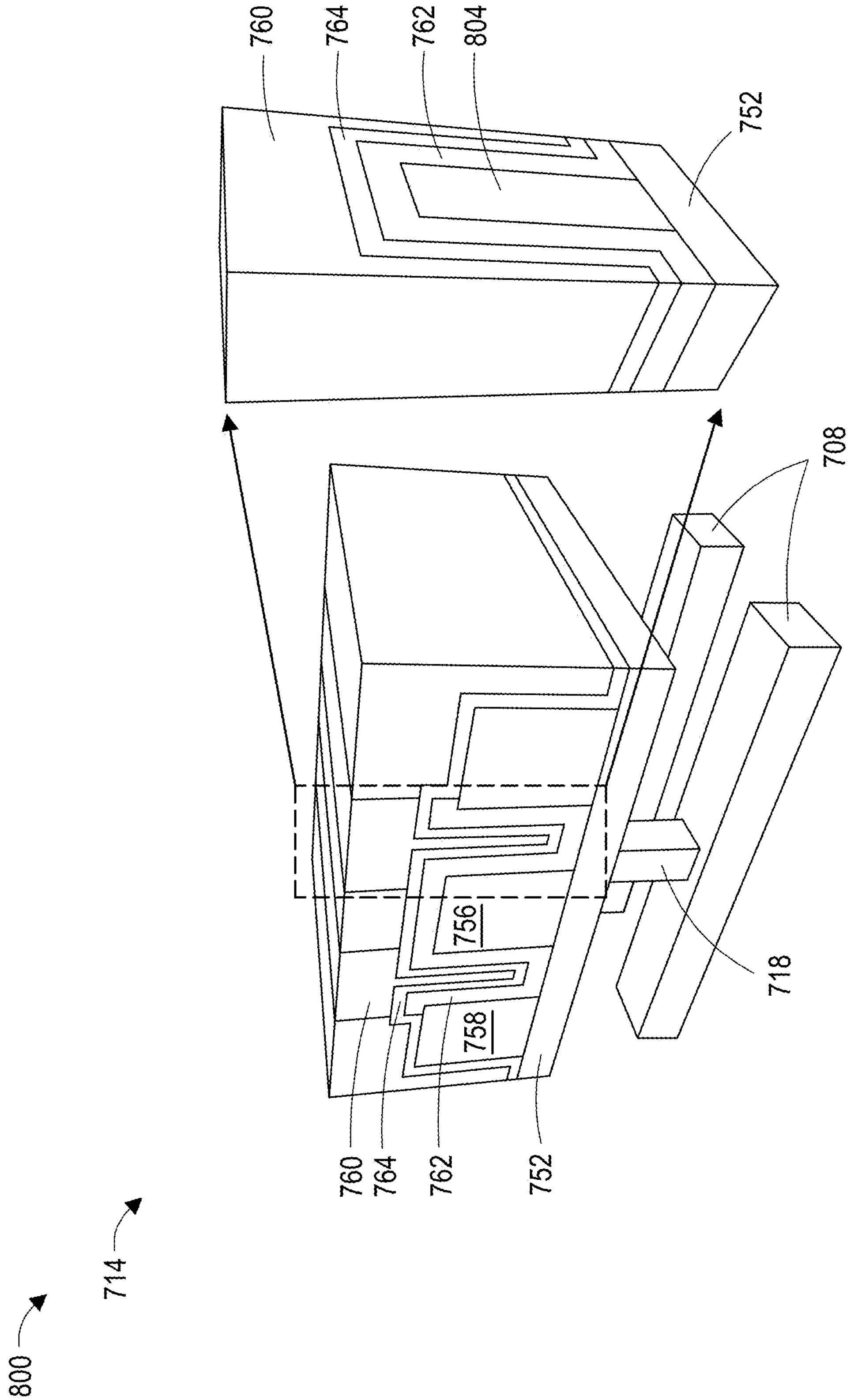

As shown in FIG. 8G, a gate structure 760 may be formed in the dielectric layer 754. The gate structure 760 may be formed over and/or on the spacer layer 806, over and/or on the gate dielectric layer 764, and/or over the channel layer 762. The deposition tool 102 and/or the plating tool 112 may deposit the gate structure 760 using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the gate structure 760.

As indicated above, FIGS. 8A-8G are provided as an example. Other examples may differ from what is described with regard to FIGS. 8A-8G.

Figure 9:
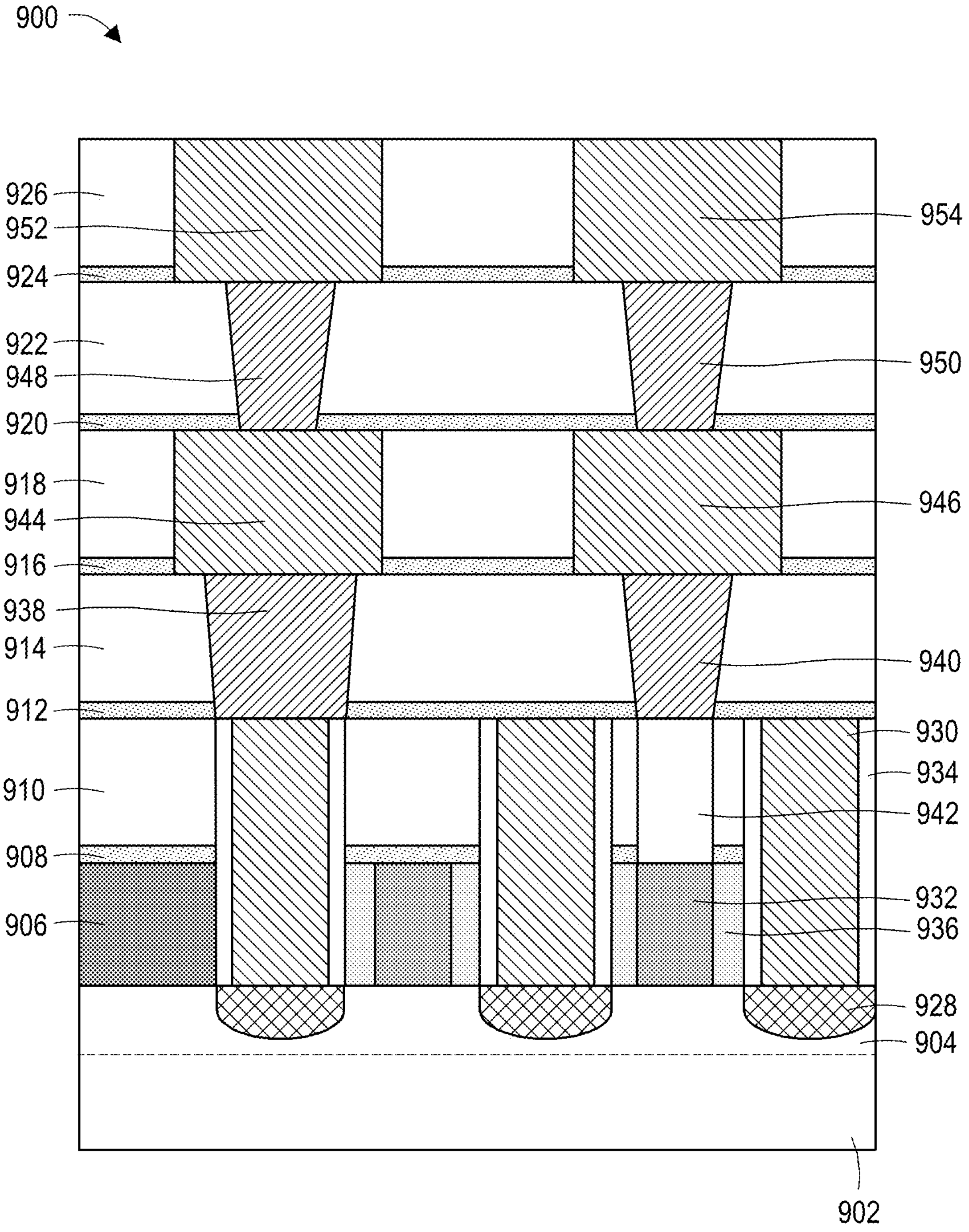
FIG. 9 is a diagram of a portion of an example semiconductor device described herein.

FIG. 9 is a diagram of a portion of an example semiconductor device 900 described herein. The semiconductor device 900 includes an example of a semiconductor device that may include a memory device (e.g., an SRAM, a DRAM), a logic device, a processor, an input/output device, or another type of semiconductor device that includes one or more transistors. The semiconductor device 900 may include a substrate 902 and one or more fin structures 904 formed in the substrate 902.

The semiconductor device 900 includes one or more stacked layers, including a dielectric layer 906, an etch stop layer (ESL) 908, a dielectric layer 910, an ESL 912, a dielectric layer 914, an ESL 916, a dielectric layer 918, an ESL 920, a dielectric layer 922, an ESL 924, and a dielectric layer 926, among other examples. The dielectric layers 906, 910, 914, 918, 922, and 926 are included to electrically isolate various structures of the semiconductor device 900. The dielectric layers 906, 910, 914, 918, 922, and 926 include a silicon nitride (SiNx), an oxide (e.g., a silicon oxide (SiOx) and/or another oxide material), and/or another type of dielectric material. The ESLs 908, 912, 916, 920, 924 includes a layer of material that is configured to permit various portions of the semiconductor device 900 (or the layers included therein) to be selectively etched or protected from etching to form one or more of the structures included in the semiconductor device 900.

As further shown in FIG. 9, the semiconductor device 900 includes a plurality of epitaxial (epi) regions 928 that are grown and/or otherwise formed on and/or around portions of the fin structure 904. The epitaxial regions 928 are formed by epitaxial growth. In some implementations, the epitaxial regions 928 are formed in recessed portions in the fin structure 904. The recessed portions may be formed by strained source drain (SSD) etching of the fin structure 904 and/or another type etching operation. The epitaxial regions 928 function as source or drain regions of the transistors included in the semiconductor device 900.

The epitaxial regions 928 are electrically connected to metal source or drain contacts 930 of the transistors included in the semiconductor device 900. The metal source or drain contacts (MDs or CAs) 930 include cobalt (Co), ruthenium (Ru), and/or another conductive or metal material. The transistors further include gates 932 (MGs), which are formed of a polysilicon material, a metal (e.g., tungsten (W) or another metal), and/or another type of conductive material. The metal source or drain contacts 930 and the gates 932 are electrically isolated by one or more sidewall spacers, including spacers 934 in each side of the metal source or drain contacts 930 and spacers 936 on each side of the gate 932. The spacers 934 and 936 include a silicon oxide ($SiO_x$), a silicon nitride ($Si_xN_y$), a silicon oxy carbide (SiOC), a silicon oxycarbonitride (SiOCN), and/or another suitable material. In some implementations, the spacers 934 are omitted from the sidewalls of the source or drain contacts 930.

As further shown in FIG. 9, the metal source or drain contacts 930 and the gates 932 are electrically connected to one or more types of interconnects. The interconnects electrically connect the transistors of the semiconductor device 900 and/or electrically connect the transistors to other areas and/or components of the semiconductor device 900. In some implementations, the interconnects electrically connect the transistors in the front end of line (FEOL) region of the semiconductor device 900 to a back end of line (BEOL) region of the semiconductor device 900.

The metal source or drain contacts 930 are electrically connected to source or drain interconnects 938 (e.g., source/drain vias or VDs). One or more of the gates 932 are electrically connected to gate interconnects 940 (e.g., gate vias or VGs). The interconnects 938 and 940 include a conductive material such as tungsten, cobalt, ruthenium, copper, and/or another type of conductive material. In some implementations, the gates 932 are electrically connected to the gate interconnects 940 by gate contacts 942 (CB or MP) to reduce contact resistance between the gates 932 and the gate interconnects 940. The gate contacts 942 include tungsten (W), cobalt (Co), ruthenium (Ru), titanium (Ti), aluminum (Al), copper (Cu) or gold (Au), among other examples of conductive materials.

As further shown in FIG. 9, the interconnects 938 and 940 are electrically connected to a plurality of BEOL layers, each including one or more metallization layers and/or vias. As an example, the interconnects 938 and 940 may be electrically connected to an M0 metallization layer that includes conductive structures 944 and 946. The M0 metallization layer is electrically connected to a V0 via layer that includes vias 948 and 950. The V0 via layer is electrically connected to an M1 metallization that includes conductive structures 952 and 954. In some implementations, the BEOL layers of the semiconductor device 900 includes additional metallization layers and/or vias that connect the semiconductor device 900 to a package.

One or more memory cell structures (e.g., a memory cell structure 300, a memory cell structure 700) may be included in one or more layers and/or one or more regions (e.g., an FEOL region, a BEOL region) of the semiconductor device 900. In some implementations, a read transistor (e.g., a read transistor 314, a read transistor 714) may be implemented by a transistor included in the FEOL region of the semiconductor device 900, a storage transistor (e.g., a storage transistor 312, a storage transistor 712) may be included in the BEOL region in the dielectric layer 914, and a write transistor (e.g., a write transistor 310, a write transistor 710) may be included in the BEOL region in the dielectric layer 914 or the dielectric layer 918.

In some implementations, a read transistor (e.g., a read transistor 314, a read transistor 714), a storage transistor (e.g., a storage transistor 312, a storage transistor 712), and a write transistor (e.g., a write transistor 310, a write transistor 710) may be included in a single dielectric layer in the BEOL region of the semiconductor device 900 (e.g., the dielectric layer 914, 918, 922, or 926).

In some implementations, a read transistor (e.g., a read transistor 314, a read transistor 714), a storage transistor (e.g., a storage transistor 312, a storage transistor 712), and a write transistor (e.g., a write transistor 310, a write transistor 710) may be included in separate dielectric layers in the BEOL region of the semiconductor device 900. For example, a read transistor may be included in the dielectric layer 914, a storage transistor may be included in the dielectric layer 918, and a write transistor may be included in the dielectric layer 922. As another example, a read transistor may be included in the dielectric layer 918, a storage transistor may be included in the dielectric layer 922, and a write transistor may be included in the dielectric layer 926.

In some implementations, two of a read transistor (e.g., a read transistor 314, a read transistor 714), a storage transistor (e.g., a storage transistor 312, a storage transistor 712), or a write transistor (e.g., a write transistor 310, a write transistor 710) may be included in the same dielectric layer in the BEOL region of the semiconductor device 900. For example, a read transistor and a storage transistor may be included in the dielectric layer 914, and a write transistor may be included in the dielectric layer 918. As another example, a read transistor may be included in the dielectric layer 914, and a storage transistor and a write transistor may be included in the dielectric layer 918.

As indicated above, FIG. 9 is provided as an example. Other examples may differ from what is described with regard to FIG. 9.

Figure 10:
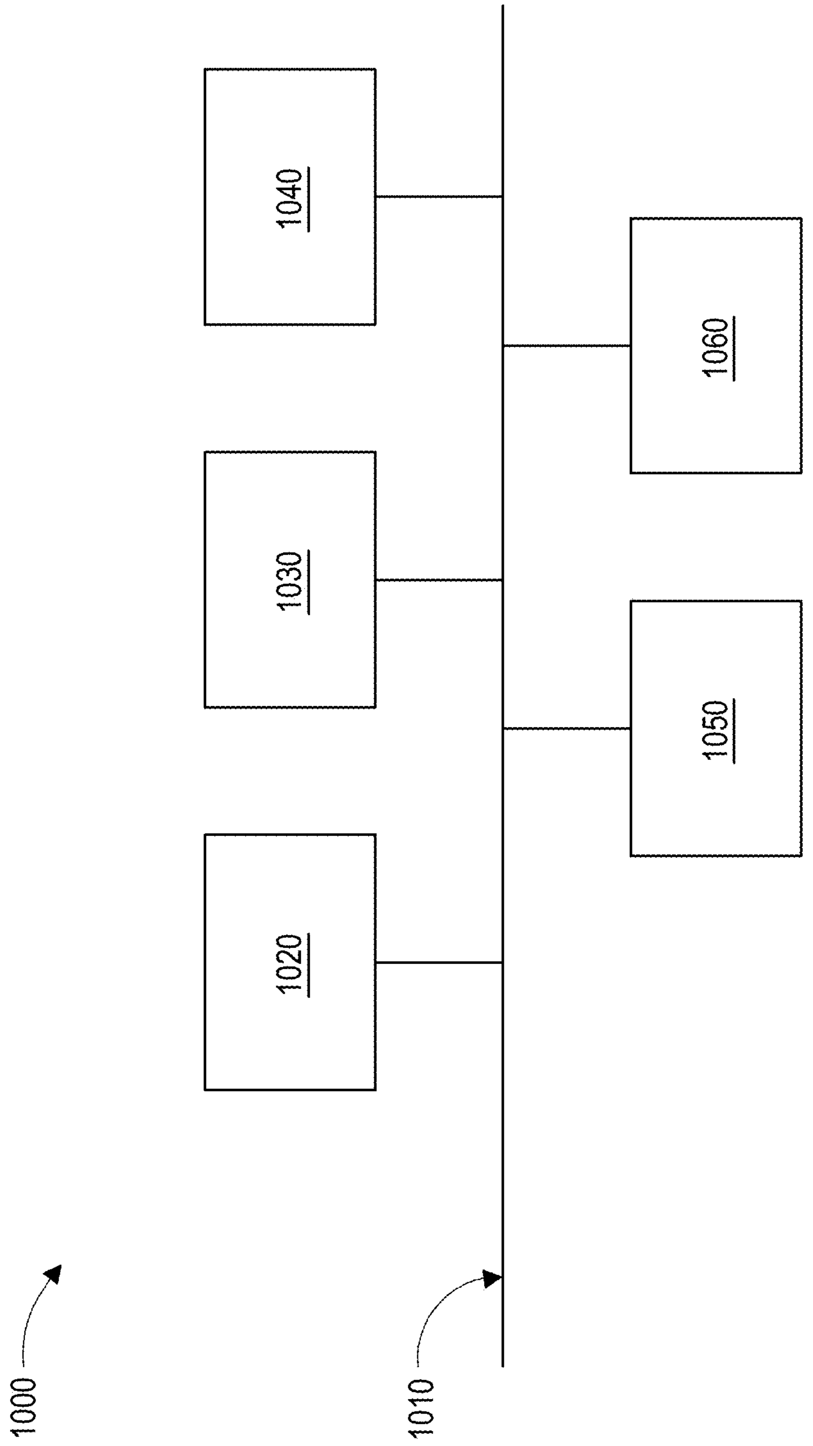
FIG. 10 is a diagram of example components of one or more devices described herein.

FIG. 10 is a diagram of example components of a device 1000 described herein. In some implementations, one or more of the semiconductor processing tools 102-112 and/or the wafer/die transport tool 114 may include one or more devices 1000 and/or one or more components of device 1000. As shown in FIG. 10, device 1000 may include a bus 1010, a processor 1020, a memory 1030, an input component 1040, an output component 1050, and a communication component 1060.

Bus 1010 may include one or more components that enable wired and/or wireless communication among the components of device 1000. Bus 1010 may couple together two or more components of FIG. 10, such as via operative coupling, communicative coupling, electronic coupling, and/or electric coupling. Processor 1020 may include a central processing unit, a graphics processing unit, a microprocessor, a controller, a microcontroller, a digital signal processor, a field-programmable gate array, an application-specific integrated circuit, and/or another type of processing component. Processor 1020 is implemented in hardware, firmware, or a combination of hardware and software. In some implementations, processor 1020 may include one or more processors capable of being programmed to perform one or more operations or processes described elsewhere herein.

Memory 1030 may include volatile and/or nonvolatile memory. For example, memory 1030 may include random access memory (RAM), read only memory (ROM), a hard disk drive, and/or another type of memory (e.g., a flash memory, a magnetic memory, and/or an optical memory). Memory 1030 may include internal memory (e.g., RAM, ROM, or a hard disk drive) and/or removable memory (e.g., removable via a universal serial bus connection). Memory 1030 may be a non-transitory computer-readable medium. Memory 1030 stores information, instructions, and/or software (e.g., one or more software applications) related to the operation of device 1000. In some implementations, memory 1030 may include one or more memories that are coupled to one or more processors (e.g., processor 1020), such as via bus 1010.

Input component 1040 enables device 1000 to receive input, such as user input and/or sensed input. For example, input component 1040 may include a touch screen, a keyboard, a keypad, a mouse, a button, a microphone, a switch, a sensor, a global positioning system sensor, an accelerometer, a gyroscope, and/or an actuator. Output component 1050 enables device 1000 to provide output, such as via a display, a speaker, and/or a light-emitting diode. Communication component 1060 enables device 1000 to communicate with other devices via a wired connection and/or a wireless connection. For example, communication component 1060 may include a receiver, a transmitter, a transceiver, a modem, a network interface card, and/or an antenna.

Device 1000 may perform one or more operations or processes described herein. For example, a non-transitory computer-readable medium (e.g., memory 1030) may store a set of instructions (e.g., one or more instructions or code) for execution by processor 1020. Processor 1020 may execute the set of instructions to perform one or more operations or processes described herein. In some implementations, execution of the set of instructions, by one or more processors 1020, causes the one or more processors 1020 and/or the device 1000 to perform one or more operations or processes described herein. In some implementations, hardwired circuitry is used instead of or in combination with the instructions to perform one or more operations or processes described herein. Additionally, or alternatively, processor 1020 may be configured to perform one or more operations or processes described herein. Thus, implementations described herein are not limited to any specific combination of hardware circuitry and software.

The number and arrangement of components shown in FIG. 10 are provided as an example. Device 1000 may include additional components, fewer components, different components, or differently arranged components than those shown in FIG. 10. Additionally, or alternatively, a set of components (e.g., one or more components) of device 1000 may perform one or more functions described as being performed by another set of components of device 1000.

Figure 11:
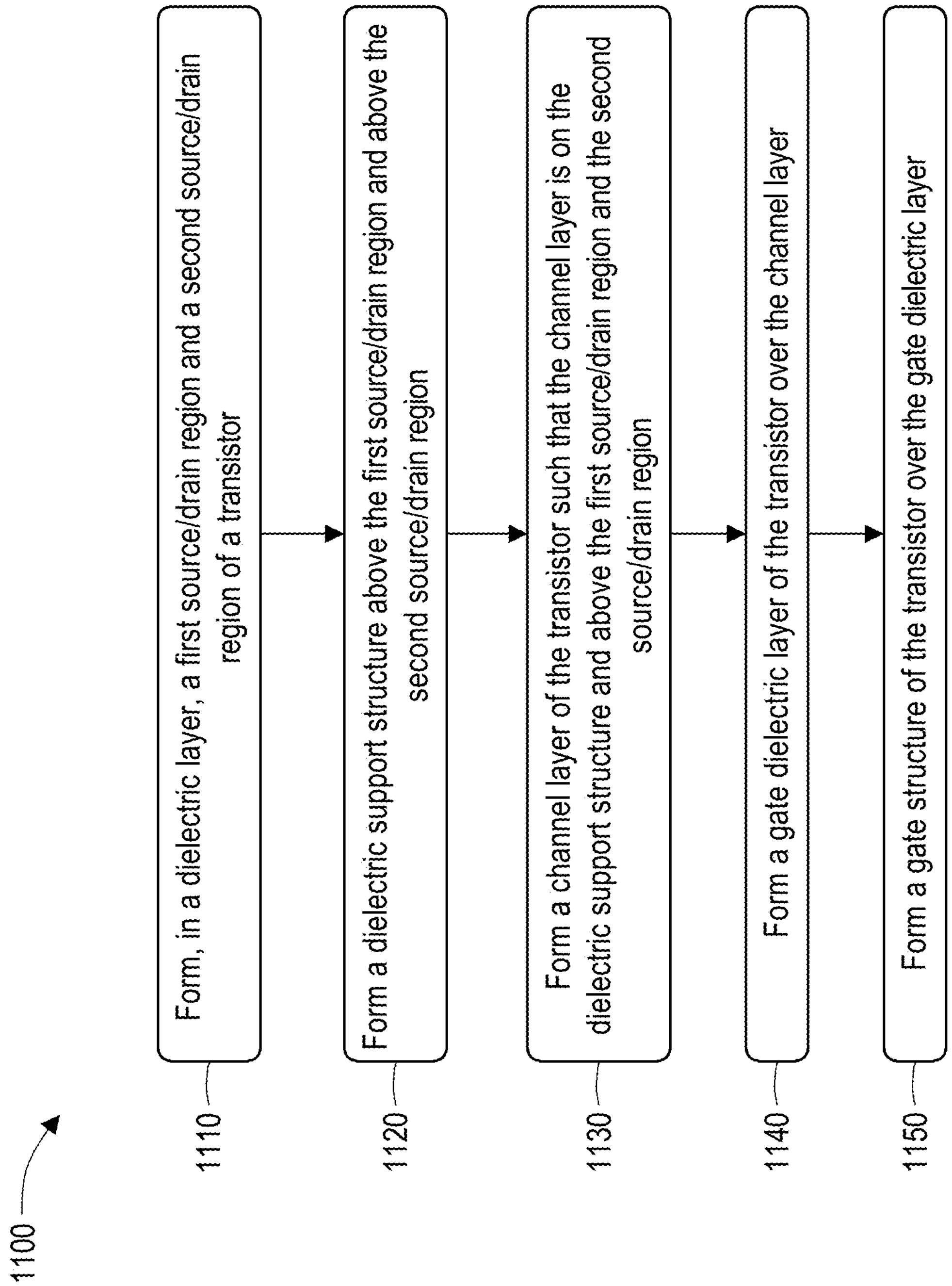
FIG. 11 is a flowchart of an example process associated with forming a transistor of memory cell.

FIG. 11 is a flowchart of an example process 1100 associated with forming a transistor of a memory cell. In some implementations, one or more process blocks of FIG. 11 are performed by one or more semiconductor processing tools (e.g., one or more of the semiconductor processing tools 102-112). Additionally, or alternatively, one or more process blocks of FIG. 11 may be performed by one or more components of device 1000, such as processor 1020, memory 1030, input component 1040, output component 1050, and/or communication component 1060.

As shown in FIG. 11, process 1100 may include forming, in a dielectric layer, a first source/drain region and a second source/drain region of a transistor (block 1110). For example, one or more of the semiconductor processing tools 102-112 may form, in a dielectric layer (e.g., a dielectric layer 336, 402, and/or 736), a first source/drain region (e.g., a source/drain region 342, 408, and/or 742) and a second source/drain region (e.g., a source/drain region 344, 410, and/or 744) of the transistor, as described herein.

As further shown in FIG. 11, process 1100 may include forming a dielectric support structure above the first source/drain region and above the second source/drain region (block 1120). For example, one or more of the semiconductor processing tools 102-112 may form a dielectric support structure (e.g., a dielectric support structure 340, 406, and/or 740) above the first source/drain region and above the second source/drain region, as described herein.

As further shown in FIG. 11, process 1100 may include forming a channel layer of the transistor such that the channel layer is on the dielectric support structure and above the first source/drain region and the second source/drain region (block 1130). For example, one or more of the semiconductor processing tools 102-112 may form a channel layer (e.g., a channel layer 348, 414, and/or 748) of the transistor such that the channel layer is on the dielectric support structure and above the first source/drain region and the second source/drain region, as described herein. In some implementations, the channel layer wraps around three sides of the dielectric support structure and extends over top surfaces of the first source/drain region and the second source/drain region.

As further shown in FIG. 11, process 1100 may include forming a gate dielectric layer of the transistor over the channel layer (block 1140). For example, one or more of the semiconductor processing tools 102-112 may form a gate dielectric layer (e.g., a gate dielectric layer 350, 416, and/or 716) of the transistor over the channel layer, as described herein.

As further shown in FIG. 11, process 1100 may include forming a gate structure of the transistor over the gate dielectric layer (block 1150). For example, one or more of the semiconductor processing tools 102-112 may form a gate structure (e.g., a gate structure 346, 412, 746) of the transistor over the gate dielectric layer, as described herein.

Process 1100 may include additional implementations, such as any single implementation or any combination of implementations described below and/or in connection with one or more other processes described elsewhere herein.

In a first implementation, forming the first source/drain region includes forming the first source/drain region such that the first source/drain region is connected to an interconnect structure (e.g., an interconnect structure 318 and/or 718) that is connected to a ground conductive structure (e.g., a ground conductive structure 316 and/or 716). In a second implementation, alone or in combination with the first implementation, forming the gate dielectric layer includes depositing the gate dielectric layer by conformal deposition such that a shape of the gate dielectric layer conforms to a shape of channel layer.

In a third implementation, alone or in combination with one or more of the first and second implementations, the dielectric layer includes a first dielectric layer, process 1100 includes forming a second dielectric layer (e.g., a dielectric layer 338, 404, and/or 738) over the first dielectric layer after forming the gate dielectric layer, and forming the gate structure includes forming the gate structure in the second dielectric layer. In a fourth implementation, alone or in combination with one or more of the first through third implementations, process 1100 includes forming a spacer layer (e.g., a spacer layer 606) on the gate dielectric layer prior to forming the gate structure, forming the gate structure includes forming the gate structure on the spacer layer.

In a fifth implementation, alone or in combination with one or more of the first through fourth implementations, forming the channel layer includes forming a layer of channel material by conformal deposition over the dielectric layer, the dielectric support structure, the first source/drain region, and the second source/drain region, and performing an etch back operation to remove first portions of the layer of channel material such that second portions of the layer of channel material remain over the dielectric support structure, the first source/drain region, and the second source/drain region, wherein the second portions of the layer of channel material correspond to the channel layer.

Although FIG. 11 shows example blocks of process 1100, in some implementations, process 1100 includes additional blocks, fewer blocks, different blocks, or differently arranged blocks than those depicted in FIG. 11. Additionally, or alternatively, two or more of the blocks of process 1100 may be performed in parallel.

In this way, a capacitorless DRAM cell may include a plurality of transistors. At least a subset of the transistors may include a channel layer that approximately resembles an inverted U shape, an ohm symbol (Ω) shape, or an uppercase/capital omega (Ω) shape. The particular shape of the channel layer provides an increased channel length for the subset of the transistors, which may reduce the off current and may reduce current leakage in the subset of the transistors. The reduced off current and reduced current leakage may increase data retention in the subset of the transistors and/or may increase the reliability of the subset of the transistors without increasing the footprint of the subset of the transistors. Moreover, the particular shape of the channel layer enables the subset of the transistors to be formed with a top-gate structure, which provides low integration complexity with other transistors in the capacitorless DRAM cell.

As described in greater detail above, some implementations described herein provide a memory cell structure. The memory cell structure includes a first transistor coupled with a word line conductive structure and a bit line conductive structure. The memory cell structure includes a second transistor above the first transistor and coupled with the first transistor and to a ground conductive structure. The memory cell structure includes a third transistor above the second transistor and coupled with the second transistor, a write word line conductive structure, and a write bit line conductive structure, where at least one of the second transistor or the third transistor comprises a channel layer that includes an inverted approximately U-shaped portion and a plurality of extension portions, each coupled with a respective end of the inverted approximately U-shaped portion.

As described in greater detail above, some implementations described herein provide a DRAM cell structure. The DRAM includes a first transistor coupled with a word line conductive structure and a bit line conductive structure. The DRAM cell structure includes a second transistor above the first transistor and coupled with the first transistor and to a ground conductive structure, where the second transistor comprises: a first plurality of source/drain regions a first channel layer above the first plurality of source/drain regions a first gate structure above the first plurality of source/drain regions and at least partially wrapping around the first channel layer. The DRAM cell structure includes a third transistor above the second transistor and coupled with the second transistor, a write word line conductive structure, and a write bit line conductive structure, where the third transistor comprises: a second plurality of source/drain regions a second channel layer above the second plurality of source/drain regions a second gate structure above the second plurality of source/drain regions and at least partially wrapping around the second channel layer.

As described in greater detail above, some implementations described herein provide a method of forming a transistor of a memory cell. The method of forming transistor of memory cell includes forming, in a dielectric layer, a first source/drain region and a second source/drain region of the transistor. The method of forming transistor of memory cell includes forming a dielectric support structure above the first source/drain region and above the second source/drain region. The method of forming transistor of memory cell includes forming a channel layer of the transistor such that the channel layer is on the dielectric support structure and above the first source/drain region and the second source/drain region, where the channel layer wraps around three sides of the dielectric support structure and extends over top surfaces of the first source/drain region and the second source/drain region. The method of forming transistor of memory cell includes forming a gate dielectric layer of the transistor over the channel layer. The method of forming transistor of memory cell includes forming a gate structure of the transistor over the gate dielectric layer.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell structure, comprising:
- a first transistor coupled with a word line conductive structure and a bit line conductive structure;
- a second transistor above the first transistor and coupled with the first transistor and to a ground conductive structure; and
- a third transistor above the second transistor and coupled with the second transistor, a write word line conductive structure, and a write bit line conductive structure,
  - wherein at least one of the second transistor or the third transistor comprises a channel layer that comprises:
    - an inverted approximately U-shaped portion, wherein the inverted approximately U-shaped portion comprises:

a first elongated portion;

a second elongated portion;

a third elongated portion coupled with the first elongated portion and the second elongated portion at opposing ends of the third elongated portion;

a first extension portion; and a second extension portion that is approximately parallel with the first extension portion, wherein the first extension portion and the second extension portion are approximately parallel with the third elongated portion and approximately perpendicular with the first elongated portion and the second elongated portion.

2. The memory cell structure of claim 1, wherein the first elongated portion is approximately parallel with the second elongated portion; and wherein the third elongated portion is approximately perpendicular with the first elongated portion and the second elongated portion.

3. The memory cell structure of claim 1, wherein a length (L3) of at least one the first elongated portion or the second elongated portion is greater relative to a length (L1) of at least one of the first extension portion or the second extension portion.

4. The memory cell structure of claim 1, wherein the first transistor comprises:

a first source/drain region;

a second source/drain region; and a gate structure between the first source/drain region and the second source/drain region.

5. The memory cell structure of claim 4, wherein the first transistor comprises another channel layer that wraps around at least three sides of the gate structure, and wherein the other channel layer is between the gate structure and the first source/drain region, and is between the gate structure and the second source/drain region.

6. The memory cell structure of claim 5, wherein the other channel layer corresponds to an approximately ohm (Ω) symbol shape.

7. A dynamic random access memory (DRAM) cell structure, comprising:

a first transistor coupled with a word line conductive structure and a bit line conductive structure;

a second transistor above the first transistor and coupled with the first transistor and to a ground conductive structure, wherein the second transistor comprises:

a first plurality of source/drain regions;

a first channel layer above the first plurality of source/drain regions, wherein the first channel layer comprises:

a first elongated portion;

a second elongated portion;

a third elongated portion coupled with the first elongated portion and the second elongated portion at opposing ends of the third elongated portion;

a first extension portion; and a second extension portion that is approximately parallel with the first extension portion, wherein the first extension portion and the second extension portion are approximately parallel with the third elongated portion and approximately perpendicular with the first elongated portion and the second elongated portion; and a first gate structure above the first plurality of source/drain regions and at least partially wrapping around the first channel layer; and a third transistor above the second transistor and coupled with the second transistor, a write word line conductive structure, and a write bit line conductive structure, wherein the third transistor comprises:

a second plurality of source/drain regions;

a second channel layer above the second plurality of source/drain regions; and a second gate structure above the second plurality of source/drain regions and at least partially wrapping around the second channel layer.

8. The DRAM cell structure of claim 7, wherein the word line conductive structure is a read word line conductive structure that is below the first transistor;

wherein the bit line conductive structure is a read bit line conductive structure that is above the first transistor and below the second transistor;

wherein the read word line conductive structure is coupled with a gate structure of the first transistor;

wherein the read bit line conductive structure is coupled with a first source/drain region of the first transistor; and wherein a second source/drain region of the first transistor is coupled with a source/drain region of the first plurality of source/drain regions of the second transistor.

9. The DRAM cell structure of claim 7, wherein the ground conductive structure is below the second transistor and above the first transistor;

wherein a first source/drain region, of the first plurality of source/drain regions of the second transistor, is coupled with the ground conductive structure;

wherein a second source/drain region, of the first plurality of source/drain regions of the second transistor, is coupled with a source/drain region of the first transistor; and wherein the first gate structure of the second transistor is coupled with a source/drain region of the second plurality of source/drain regions of the third transistor.

10. The DRAM cell structure of claim 7, wherein the write bit line conductive structure is above the second transistor and below the third transistor;

wherein the write word line conductive structure is above the third transistor;

wherein a first source/drain region, of the second plurality of source/drain regions of the third transistor, is coupled with the write bit line conductive structure;

wherein a second source/drain region, of the second plurality of source/drain regions of the third transistor, is coupled with the first gate structure of the second transistor; and wherein the second gate structure of the third transistor is coupled with the write word line conductive structure.

11. The DRAM cell structure of claim 7, wherein at least one of the first channel layer or the second channel layer corresponds to an approximately ohm (Ω) symbol shape.

12. The DRAM cell structure of claim 7, wherein the first extension portion is coupled with a first source/drain region of the first plurality of source/drain regions; and wherein the second extension portion is coupled with a second source/drain region of the first plurality of source/drain regions.

13. The DRAM cell structure of claim 7,
wherein the first elongated portion is approximately parallel with the second elongated portion; and
wherein the third elongated portion is approximately perpendicular with the first elongated portion and the second elongated portion.

14. The DRAM cell structure of claim 7, wherein a length (L3) of at least one the first elongated portion or the second elongated portion is greater relative to a length (L1) of at least one of the first extension portion or the second extension portion.

15. A method of forming a transistor of a memory cell, comprising:
forming, in a dielectric layer, a first source/drain region and a second source/drain region of the transistor;
forming a dielectric support structure above the first source/drain region and above the second source/drain region;
forming a channel layer of the transistor such that the channel layer is on the dielectric support structure and above the first source/drain region and the second source/drain region,
wherein the channel layer wraps around three sides of the dielectric support structure and extends over top surfaces of the first source/drain region and the second source/drain region;
forming a gate dielectric layer of the transistor over the channel layer;
forming a spacer layer on the gate dielectric layer prior to forming a gate structure of the transistor; and
forming the gate structure of the transistor on the spacer layer and over the gate dielectric layer.

16. The method of claim 15, wherein forming the first source/drain region comprises:
forming the first source/drain region such that the first source/drain region is connected to an interconnect structure that is connected to a ground conductive structure.

17. The method of claim 15, wherein forming the gate dielectric layer comprises:
depositing the gate dielectric layer by conformal deposition such that a shape of the gate dielectric layer conforms to a shape of channel layer.

18. The method of claim 15,
wherein the dielectric layer comprises a first dielectric layer;
wherein the method further comprises:
forming a second dielectric layer over the first dielectric layer after forming the gate dielectric layer; and
wherein forming the gate structure comprises:
forming the gate structure in the second dielectric layer.

19. The method of claim 15, wherein forming the channel layer comprises:
forming a layer of channel material by conformal deposition over the dielectric layer, the dielectric support structure, the first source/drain region, and the second source/drain region; and
performing an etch back operation to remove first portions of the layer of channel material such that second portions of the layer of channel material remain over the dielectric support structure, the first source/drain region, and the second source/drain region,
wherein the second portions of the layer of channel material correspond to the channel layer.

20. The method of claim 15, wherein the channel layer corresponds to an approximately ohm (Ω) symbol shape.

* * * * *